(12) United States Patent
Kanetake et al.

(10) Patent No.: US 10,622,350 B2
(45) Date of Patent: Apr. 14, 2020

(54) SEMICONDUCTOR DEVICE

(71) Applicant: FUJI ELECTRIC CO., LTD., Kanagawa (JP)

(72) Inventors: Akinori Kanetake, Matsumoto (JP); Misaki Takahashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/211,253

(22) Filed: Dec. 6, 2018

(65) Prior Publication Data
US 2019/0252374 A1 Aug. 15, 2019

(30) Foreign Application Priority Data
Feb. 14, 2018 (JP) .................. 2018-024227

(51) Int. Cl.
| | |
|---|---|
| *H01L 29/66* | (2006.01) |
| *H01L 27/06* | (2006.01) |
| *H01L 29/36* | (2006.01) |
| *H01L 29/861* | (2006.01) |
| *H01L 29/739* | (2006.01) |
| *H01L 29/423* | (2006.01) |

(Continued)

(52) U.S. Cl.
CPC ...... *H01L 27/0664* (2013.01); *H01L 29/0615* (2013.01); *H01L 29/0696* (2013.01);
(Continued)

(58) Field of Classification Search
CPC ............. H01L 27/0664; H01L 29/0615; H01L 29/0696; H01L 29/0834; H01L 29/1095; H01L 29/32; H01L 29/36; H01L 29/407; H01L 29/42372; H01L 29/4238; H01L 29/66348; H01L 29/7397; H01L 29/861
See application file for complete search history.

(56) References Cited

U.S. PATENT DOCUMENTS

| | | |
|---|---|---|
| 2012/0132954 A1 | 5/2012 | Kouno |
| 2014/0048847 A1 | 2/2014 | Yamashita |

(Continued)

FOREIGN PATENT DOCUMENTS

| | | |
|---|---|---|
| JP | 2011243694 A | 12/2011 |
| JP | 2012129504 A | 7/2012 |

(Continued)

OTHER PUBLICATIONS

Extended European Search Report for counterpart European Application No. 19150185.7, issued by the European Patent Office dated Aug. 5, 2019.

*Primary Examiner* — Robert G Bachner

(57) ABSTRACT

Provided is a semiconductor device including transistor regions and diode regions each extending from a given one edge of an active region to a different edge of the active region, a first-conductivity-type pad well region in contact with a gate runner region shaped like a rectangular ring and provided within the gate runner region, and first-conductivity-type collector regions provided in the transistor regions in a one-to-one correspondence and second-conductivity-type cathode regions provided in the diode regions in a one-to-one correspondence. Here, an edge of the pad well region at which the pad well region ends in an arranging direction extends in an extending direction, and the arranging direction is orthogonal to the extending direction in which the transistor regions and the diode regions extend, and any one or more of the collector regions are positioned below the edge of the pad well region.

14 Claims, 13 Drawing Sheets

(51) Int. Cl.
*H01L 29/06* (2006.01)
*H01L 29/40* (2006.01)
*H01L 29/10* (2006.01)
*H01L 29/32* (2006.01)
*H01L 29/08* (2006.01)

(52) U.S. Cl.
CPC .......... *H01L 29/1095* (2013.01); *H01L 29/36* (2013.01); *H01L 29/407* (2013.01); *H01L 29/4238* (2013.01); *H01L 29/42372* (2013.01); *H01L 29/66348* (2013.01); *H01L 29/7397* (2013.01); *H01L 29/861* (2013.01); *H01L 29/0834* (2013.01); *H01L 29/32* (2013.01)

(56) References Cited

U.S. PATENT DOCUMENTS

| | | |
|---|---|---|
| 2014/0084335 A1 | 3/2014 | Senoo |
| 2014/0217465 A1 | 8/2014 | Soeno |
| 2016/0043073 A1 | 2/2016 | Tamura |
| 2016/0293595 A1 | 10/2016 | Narazaki |
| 2017/0018636 A1 | 1/2017 | Naito |
| 2017/0162562 A1 | 6/2017 | Haruguchi |
| 2017/0162662 A1 | 6/2017 | Naito |
| 2017/0236908 A1 | 8/2017 | Naito |
| 2018/0158815 A1 | 6/2018 | Onozawa |
| 2018/0182754 A1 | 6/2018 | Naito |

FOREIGN PATENT DOCUMENTS

| | | |
|---|---|---|
| JP | 2016197678 A | 11/2016 |
| JP | 2017028244 A | 2/2017 |
| JP | 2017103400 A | 6/2017 |
| JP | 2017135255 A | 8/2017 |
| JP | 2017224685 A | 12/2017 |
| WO | 2016098199 A1 | 6/2016 |
| WO | 2017141998 A1 | 8/2017 |
| WO | 2017155122 A1 | 9/2017 |

SEMICONDUCTOR DEVICE

The contents of the following Japanese patent application(s) are incorporated herein by reference: NO. 2018-024227 filed in JP on Feb. 14, 2018.

BACKGROUND

1. Technical Field

The present invention relates to a semiconductor device.

In the conventional art, a known reverse conducting insulated gate bipolar transistor (RC-IGBT) has an IGBT and a free wheeling diode (FWD) provided in a single semiconductor substrate (see, for example, Patent Document 1).

PRIOR ART DOCUMENTS

Patent Documents

Patent Document 1: International Publication No. 2016/098199

It is desirable that reverse recovery current flowing through the FWD region of the RC-IGBT region does not cause breakdown in the FWD region.

SUMMARY

A first aspect of the present invention provides a semiconductor device including a plurality of transistor regions and a plurality of diode regions in a single semiconductor substrate. The semiconductor device may include the plurality of transistor regions and the plurality of diode regions, a pad well region, and a plurality of collector regions and a plurality of cathode regions. The plurality of transistor regions and the plurality of diode regions may each extend from a given one edge of an active region to a different edge of the active region. The different edge may oppose the given one edge. The active region may be enclosed within a gate runner region. The gate runner region may be shaped like a rectangular ring having four sides when the semiconductor substrate is seen from above. The pad well region may be provided in the semiconductor substrate on an upper-surface side thereof, in contact with the gate runner region that is shaped like the rectangular ring and positioned within the gate runner region. The pad well region may be of a first conductivity type. A plurality of collector regions and a plurality of cathode regions may be provided in a lower-surface-side portion of the semiconductor substrate. The collector regions may be provided at least in the plurality of transistor regions. The collector regions may be of the first conductivity type. The cathode regions may be provided in the plurality of diode regions. The cathode regions may be of a second conductivity type. An edge of the pad well region at which the pad well region ends in an arranging direction may extend in an extending direction in which the plurality of transistor regions and the plurality of diode regions extend. The arranging direction in which the plurality of transistor regions and the plurality of diode regions are arranged next to each other may be orthogonal to the extending direction in which the plurality of transistor regions and the plurality of diode regions extend. Any one or more of the collector regions may be positioned below the edge of the pad well region.

The pad well region may have a plurality of the edges extending in the extending direction. Each of the plurality of edges of the pad well region may be in contact with one of the plurality of transistor regions. The collector regions may be positioned below the plurality of edges of the pad well region.

The pad well region may be in contact with two of the plurality of transistor regions and one of the plurality of diode regions. The one diode region may be positioned between the two transistor regions. A first edge of the plurality of edges of the pad well region may be in contact with a first transistor region of the two transistor regions. A second edge of the plurality of edges of the pad well region may be in contact with a second transistor region of the two transistor regions. The second transistor region may be differently positioned than the first transistor region.

The semiconductor device may include a given one diode region that is not in contact with the pad well region. The given one diode region that is not in contact with the pad well region may be positioned opposite the pad well region in the arranging direction with a given one transistor region that is in contact with the pad well region being sandwiched therebetween. A portion of an edge of a cathode region may have a positioned-back edge. The portion of the edge of the cathode region may be an edge of a cathode region of the given one diode region that is not in contact with the pad well region and the edge of the cathode region may oppose the edge of the pad well region in the arranging direction and extend in the extending direction. The positioned-back edge may be positioned opposite the edge of the pad well region with a boundary between (i) the given one transistor region that is in contact with the pad well region and (ii) the given one diode region that is not in contact with the pad well region being sandwiched therebetween, and positioned back from the pad well region in the arranging direction toward the given one diode region that is not in contact with the pad well region.

The positioned-back edge of the edge of the cathode region may be spaced away from the edge of the pad well region by a distance equal to or greater than a thickness of the semiconductor substrate.

The positioned-back edge of the edge of the cathode region may be spaced away from the boundary by a distance equal to or greater than 90 μm.

The semiconductor substrate may include a lifetime killer region. The lifetime killer region may be provided between (i) the collector regions and the cathode regions and (ii) the upper surface of the semiconductor substrate and above the positioned-back edge of the cathode region.

The pad well region may be in contact with the given one edge of the active region and positioned in a vicinity of a middle of the given one edge in the arranging direction.

The gate runner region shaped like the rectangular ring may include a gate runner well region. The gate runner well region may be provided in the semiconductor substrate on an upper-surface side thereof. The gate runner well region may be of the first conductivity type. The semiconductor substrate may include a lifetime killer region. When the semiconductor substrate is seen from above, the lifetime killer region may extend in the extending direction from the active region to a predetermined position in the gate runner well region.

At least one diode region of the plurality of diode regions may include a plurality of contact portions. The plurality of contact portions may be provided on the upper surface of the semiconductor substrate in the active region, extend in the extending direction and spaced away from each other in the arranging direction. The gate runner region shaped like the rectangular ring may include a gate runner well region. The gate runner well region may be provided in the semiconductor substrate on an upper-surface side thereof. The gate runner well region may be of the first conductivity type. The gate runner well region may be in contact with the at least one diode region in the extending direction. An edge of the gate runner well region that is in contact with the active region may oppose in the extending direction an edge of the cathode region of the at least one diode region, and when the edge of the gate runner well region and the edge of the cathode region of the at least one diode region are imaginarily projected onto the upper surface of the semiconductor substrate, a first distance may be greater than a depth of the gate runner well region and less than a thickness of the semiconductor substrate. The first distance may be a shortest distance between the edge of the gate runner well region and the edge of the cathode region. The depth of the gate runner well region may be a depth from the upper surface of the semiconductor substrate to a bottom of the gate runner well region. The thickness of the semiconductor substrate may be a thickness between the upper surface and a lower surface of the semiconductor substrate.

An edge of the gate runner well region may oppose in the extending direction an edge of at least one contact portion of the plurality of contact portions, and when the edge of the gate runner well region and the edge of the at least one contact portion are imaginarily projected onto the upper surface of the semiconductor substrate, the first distance may be greater than a second distance. The second distance may be a shortest distance between the edge of the gate runner well region and the edge of the at least one contact portion.

When the semiconductor substrate is seen from above, transistor regions may be positioned at respective edges of the active region that oppose each other in the arranging direction of the pad well region. The pad well region may be in contact with a corner of the active region.

The plurality of diode regions may include a different diode region. The different diode region may extend in the extending direction from the pad well region to the different edge of the active region. When the semiconductor substrate is seen from above, an edge of the cathode region of the different diode region that opposes the pad well region in the extending direction may be spaced away from the pad well region.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

As used herein, the terms "upper," "on" and "above" denote one of the sides defined in the direction parallel to the depth direction of a semiconductor substrate, and the terms "lower," "under" and "below" denote the other side. The term "upper surface" denotes one of the two main surfaces of a substrate, a region, a layer or other parts, and the term "lower surface" denotes the other surface. The direction associated with the terms "upper," "lower" and the other synonyms is not limited to the gravitational direction or the direction in which semiconductor devices are attached to circuit boards and the like.

The orthogonal coordinate axes of the X, Y and Z axes may be used herein to describe the technical matters. As used herein, the X, Y and Z axes define the right-handed system. As used herein, the term "X-Y plane" denotes the plane parallel to the upper or lower surface of the semiconductor substrate, and the term "Z axis" denotes the depth direction of the semiconductor substrate, which is perpendicular to the upper or lower surface of the semiconductor substrate.

While a first conductivity type is the P type and a second conductivity type is the N type herein, the first conductivity type may be the N type and the second conductivity type may be the P type. In the latter case, the conductivity types of the substrates, layers, regions and the like in the respective embodiments are reversed. As used herein, the expression "P+ type" or "N+ type" means that the doping concentration is higher than when the expression "P type" or "N type" is used, and the expression "P− type" or "N− type" means that the doping concentration is lower than when the expression "P type" or "N type" is used.

As used herein, the term "doping concentration" denotes the concentration of the impurities that serve as donors or acceptors. The difference in concentration between the donors and the acceptors may be referred herein to as the net doping concentration or, simply, doping concentration. The doping concentration may alternatively denote the peak value of the doping concentration distribution.

Figure 1:
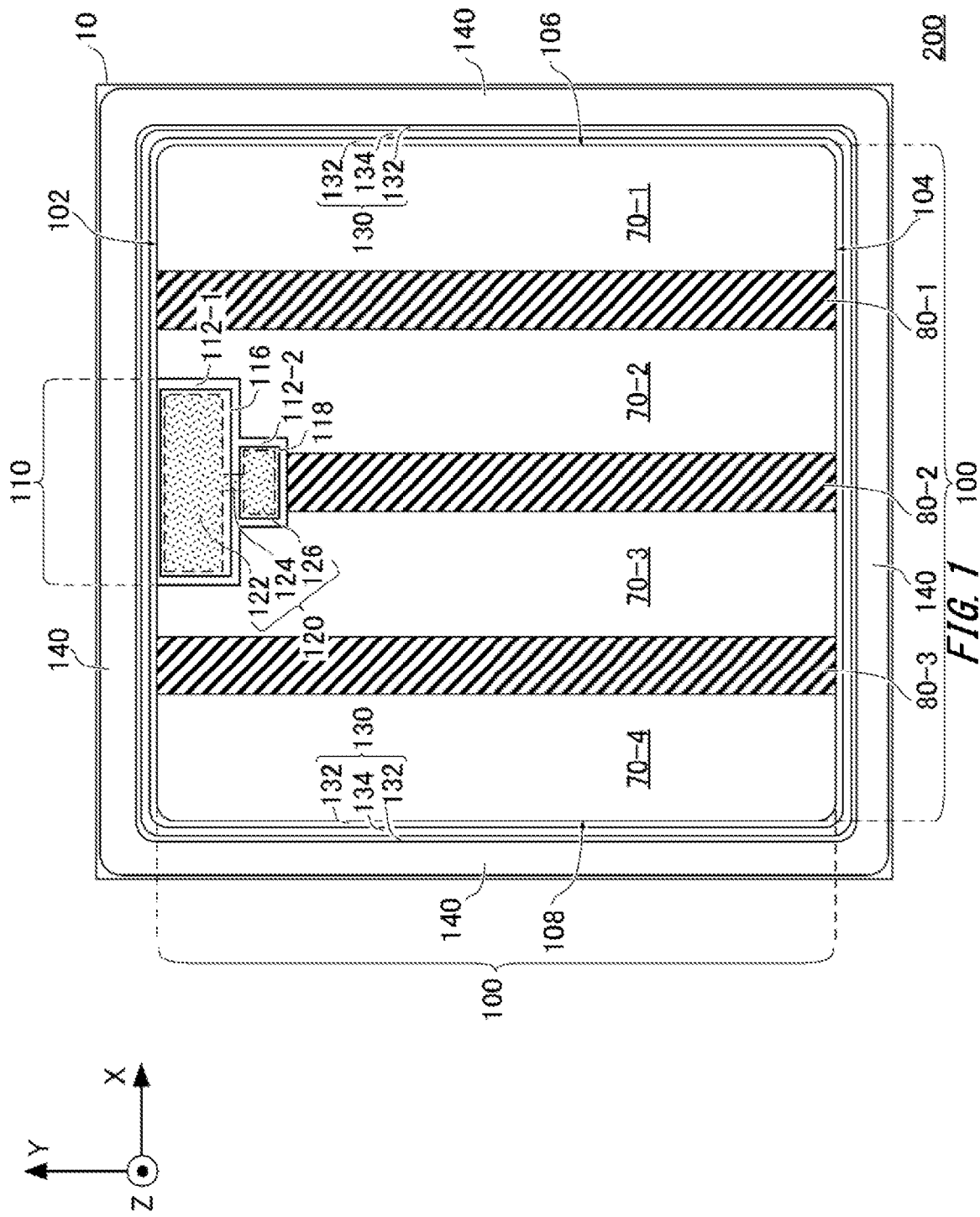
FIG. 1 is a top view showing a semiconductor device 200 relating to a first embodiment.

FIG. 1 is a top view showing a semiconductor device 200 relating to a first embodiment. In other words, FIG. 1 shows the upper surface of a semiconductor substrate 10 of the semiconductor device 200 seen from the direction parallel to the Z axis. Note that, however, FIG. 1 does not show such constituents as an emitter electrode, a gate metal layer, a passivation film to facilitate the understanding of how the respective regions are arranged relative to each other. Note that the semiconductor substrate 10 may be simply referred herein to as "the chip."

The semiconductor device 200 includes the semiconductor substrate 10. The semiconductor substrate 10 may be shaped like a rectangle. The sides of the rectangle may range from several millimeters to approximately upwards of ten millimeters. For example, the semiconductor substrate 10 is shaped like a square of 10 mm×10 mm. The semiconductor substrate 10 may be a silicon (Si) substrate, a silicon carbide (SiC) substrate, a nitride semiconductor substrate such as a gallium nitride (GaN) substrate, or the like. In the present embodiment, the semiconductor substrate 10 is a silicon substrate. When the silicon substrate is used, the N type dopants may be one or more types of elements selected from phosphorus (P) and arsenic (As), and the P type dopants may be one or more types of elements selected from boron (B) and aluminum (Al).

The semiconductor device 200 includes an active region 100, a pad region 110, a gate runner region 130 and an edge termination region 140. The active region 100 may include a plurality of transistor regions and a plurality of diode regions. In each transistor region, a current flows between the upper surface and the lower surface of the semiconductor substrate 10 when a transistor provided in the semiconductor device 200 (for example, an IGBT) is turned on. In each diode region, on the other hand, a current flows between the upper surface and the lower surface of the semiconductor substrate 10 in the reverse direction when compared with the transistor. Note that the active region 100 may be defined as the region having an emitter electrode being arranged therein when seen from above. In the present embodiment, the active region 100 is a part of the region surrounded by the gate runner region 130 when seen from above, where the part excludes the pad region 110.

In the present embodiment, the semiconductor device 200 is an RC-IGBT. In the semiconductor device 200 of the present embodiment, IGBT regions 70 and free wheeling diode (FWD) regions 80 are provided in the active region 100 of the single semiconductor substrate 10. The IGBT region 70 is described as an example of a transistor region, and the FWD region 80 is described as an example of a diode region. In the present embodiment, the IGBT regions 70 and FWD regions 80 are alternately arranged to be next to each other in the X-axis direction. In the present embodiment, the arranging direction in which the IGBT regions 70 and FWD regions 80 are arranged next to each other is parallel to the X-axis direction. When the active region 100 is seen from above, the IGBT regions 70 are provided at the respective edges of the active region 100 that face each other in the X-axis direction.

In the present embodiment, the last IGBT region 70 in the positive X-axis direction is referred to as the IGBT region 70-1 for the convenience of description. The remaining IGBT regions 70 are assigned with the reference numerals 70-2, 70-3 and 70-4 in the negative X-axis direction. Likewise, the last FWD region 80 in the positive X-axis direction is referred to as the FWD region 80-1, and the remaining FWD regions 80 are assigned with the reference numerals 80-2 and 80-3 in the negative X-axis direction, for the convenience of description. Note that the numbers of IGBT regions 70 and FWD regions 80 of the present embodiment are only mentioned as an example. The numbers of IGBT regions 70 and FWD regions 80 may be smaller or larger than in the present embodiment. The IGBT regions 70 may have an X-axis length of no less than 500 μm and no more than 1500 μm. The FWD regions 80 may have an X-axis length of no less than 100 μm and no more than 600 μm.

The active region 100 has four edges 102, 104, 106 and 108. In the present embodiment, the edge 102 opposes the edge 104 in the Y-axis direction, and the edge 106 opposes the edge 108 in the X-axis direction. The IGBT regions 70 and FWD regions 80 may extend in the Y-axis direction. The IGBT regions 70 and FWD regions 80 each extend from the edge 102 of the active region 100, which is positioned on the positive side in the Y-axis direction, to the edge 104, which is positioned on the negative side in the Y-axis direction. In the present embodiment, the extending direction in which the IGBT regions 70 and FWD regions 80 extend is parallel to the Y-axis direction. In the present embodiment, the extending direction (the Y-axis direction) is orthogonal to the arranging direction (the X-axis direction).

In the present embodiment, the pad region 110 is formed by cutting away a portion of the active region 100. In the present embodiment, the pad region 110 does not constitute the active region 100. In the present embodiment, the pad region 110 includes a P+ type pad well region 112, a polysilicon layer 120, and a gate pad 116 and a gate resistance measuring pad 118. The gate pad 116 and gate resistance measuring pad 118 may be a metal layer formed by aluminum, an aluminum-silicon alloy, or an aluminum-silicon-copper (Cu) alloy.

The pad well region 112 may occupy a larger area than the polysilicon layer 120, gate pad 116 and gate resistance measuring pad 118. In the present embodiment, the pad well region 112 is divided into a pad well region 112-1 having the gate pad 116 arranged thereon and a pad well region 112-2 having the gate resistance measuring pad 118 arranged thereon. The pad well regions 112-1 and 112-2 are each shaped like a rectangle that is longer in the X-axis direction than in the Y-axis direction. Accordingly, the pad well regions 112-1 and 112-2 of the present embodiment collectively have a convex shape protruding in the negative Y-axis direction when seen from above.

The pad well region 112 may be provided in the semiconductor substrate 10 on the upper-surface side thereof. In the present embodiment, the pad well region 112 extends from the upper surface of the semiconductor substrate 10 to a predetermined depth. The bottom of the pad well region 112 may be deeper than that of a trench portion, which will be described later. In the present embodiment, the pad well region 112 is in contact with the gate runner region 130 and, at the same time, positioned in the region enclosed by the gate runner region 130.

The pad well region 112-1 may have an X-axis length of no less than 1000 μm to no more than 1800 μm. In the X-axis direction, the pad well region 112-2 may be positioned within the area occupied by the pad well region 112-1. The pad well regions 112-1 and 112-2 may collectively have a Y-axis length of no less than 900 μm and no more than 1500 μm. In the present embodiment, the pad well regions 112-1 and 112-2 are in contact with each other in the Y-axis direction. The pad well region 112-1 is sandwiched between the pad well region 112-2 and the gate runner region 130.

The pad well region 112 may be in contact with the edge 102 of the active region 100. Furthermore, the pad well region 112 may be positioned in the vicinity of the X-axis middle of the edge 102. This enables the gate pad 116 and gate resistance measuring pad 118 to be also positioned in the vicinity of the middle of one of the sides of the gate runner region 130. Accordingly, when compared with the case where the gate pad 116 and the like are arranged at the four corners of the active region 100, lower requirements may be placed on the mounting of the gate wires on the gate pad 116. In this manner, the semiconductor device 200 can be applied to more different types of semiconductor packages and resultantly highly versatile.

The pad well region 112 may be capable of reducing the influences of the polysilicon layer 120, gate pad 116 and gate resistance measuring pad 118 provided on the pad well region 112 on the base and drift regions in the IGBT regions 70 and FWD regions 80. The pad well region 112 and the polysilicon layer 120 may be electrically insulated from each other by an insulating film provided therebetween.

In the present embodiment, the polysilicon layer 120 is divided into a first region 122 that is positioned below the gate pad 116, a third region 126 that is positioned below the gate resistance measuring pad 118 and a second region 124 that forms a bridge connecting the first region 122 and the third region 126 together. On the polysilicon layer 120, an interlayer dielectric film may be provided. The gate pad 116 and the first region 122 may be electrically connected together via an opening in the interlayer dielectric film. The gate resistance measuring pad 118 and the third region 126 may be electrically connected together via another opening in the interlayer dielectric film. The second region 124 may be entirely covered with the interlayer dielectric film.

The second region 124 of the polysilicon layer 120 is positioned, in the electric circuit, between the gate resistance measuring pad 118 and a gate conductive portion of each IGBT regions 70. The second region 124 may be considered to be an additional gate resistor (Rg) for the IGBT regions 70.

Here, a plurality of IGBT chips may be connected in parallel and used. When the chips are connected in parallel to be used, the gate metal layers of the chips are also connected in parallel. If such is the case, currents are exchanged between the gate metal layers of the chips, which may disadvantageously cause an oscillation in the gate voltage and result in the breakdown of the chips. To address this issue, an additional gate resistor (Rg) is embedded in each IGBT chip. This is expected to effectively reduce the exchange of currents between the gate metal layers that may take place when the chips are connected in parallel and prevent the occurrence of an oscillation in the gate voltage. Note that the gate metal layer may be considered to be equivalent to the gate conductive portion or a gate runner portion 134, which will be described later.

The gate pad 116 and gate resistance measuring pad 118 may be used to measure the additional gate resistor (Rg). For example, the additional gate resistor (Rg) is measured in the following manner. The gate pad 116 and gate resistance measuring pad 118 are respectively brought into contact with current and voltage measuring test pins, a predetermined current is injected between the gate pad 116 and the gate resistance measuring pad 118, and a resulting voltage drop is measured.

In the present embodiment, the parameter Rg has a predetermined value that is dependent on the X-axis width of the second region 124. The Rg value may decrease as the X-axis width of the second region 124 increases, and the Rg value may increase as the X-axis width of the second region 124 decreases.

The gate pad 116 may be electrically connected to the gate runner portion 134 of the gate runner region 130. A gate signal may be fed from outside of the semiconductor device 200 to the gate pad 116 through a gate wire. The gate pad 116 may be electrically connected to the gate runner portion 134 via the gate metal layer. The gate pad 116 may be a metal layer that is formed in the same process as the gate metal layer.

When seen from above, the gate runner region 130 may be shaped like a rectangular ring having four sides. In the present embodiment, the gate runner region 130 has four straightly shaped sides and four curved corners. The gate runner region 130 may be positioned between the active region 100 and the edge termination region 140. The gate runner region 130 may be divided into the gate runner well region 132, which is a P+ type well region, and the conductive gate runner portion 134.

The gate runner well region 132 may have a larger width than the gate runner portion 134. The gate runner portion 134 may be placed on the gate runner well region 132 and enclosed within the width of the gate runner well region 132. The gate runner portion 134 may transmit the gate signal fed from outside via the gate pad 116 to the gate conductive portions of the IGBT regions 70. The sides of the gate runner portion 134 that are in contact with the edges 102 and 104 may be electrically connected to the gate conductive portions of the IGBT regions 70. The gate runner portion 134 may have a multilayered structure made up by a gate metal layer and a polysilicon layer. Note that, however, FIG. 1 does not show the gate metal layer for the purposes of facilitating the understanding and just shows the outline of the polysilicon layer of the gate runner portion 134.

The gate metal layer of the gate runner portion 134 may be a metal layer that is made of the same material as the gate pad 116 and gate resistance measuring pad 118. In the gate runner portion 134, the gate metal layer may be provided on the polysilicon layer. The gate metal layer of the gate runner portion 134 may be connected to the polysilicon layer via a predetermined contact portion (for example, an opening in the interlayer dielectric film).

The polysilicon layer of the gate runner portion 134 may be a polysilicon layer that is doped with impurities such as phosphorus. Between the polysilicon layer of the gate runner portion 134 and the upper surface of the semiconductor substrate 10, an insulating film may be provided. The gate runner portion 134 may be electrically isolated from the semiconductor substrate 10 by this insulating film, except for the portion connected to the gate trench portion.

In the present embodiment, the gate runner region 130 does not cross the active region 100 but just surrounds the active region 100. Accordingly, when compared with the case where the gate runner region 130 crosses the active region 100, the length along which the active region 100 is in contact with the gate runner well region 132 can be reduced. This can contribute to the reduction in reverse recovery breakdown of the FWD regions 80, which will be described later.

The edge termination region 140 may be positioned between the active region 100 and the periphery of the semiconductor substrate 10, when seen from above. The edge termination region 140 may be provided on the upper surface of the semiconductor substrate 10 and surrounds the active region 100 and the gate runner region 130. The edge termination region 140 of the present embodiment extends along the periphery of the semiconductor substrate 10 and is shaped like a rectangular ring. The edge termination region 140 may be capable of reducing the electric field concentration on the upper-surface side in the semiconductor substrate 10. The edge termination region 140 may be, for example, one of a guard ring, a field plate and a RESURF (reduced surface field) structure, or a combination of two or more of these.

Figure 2:
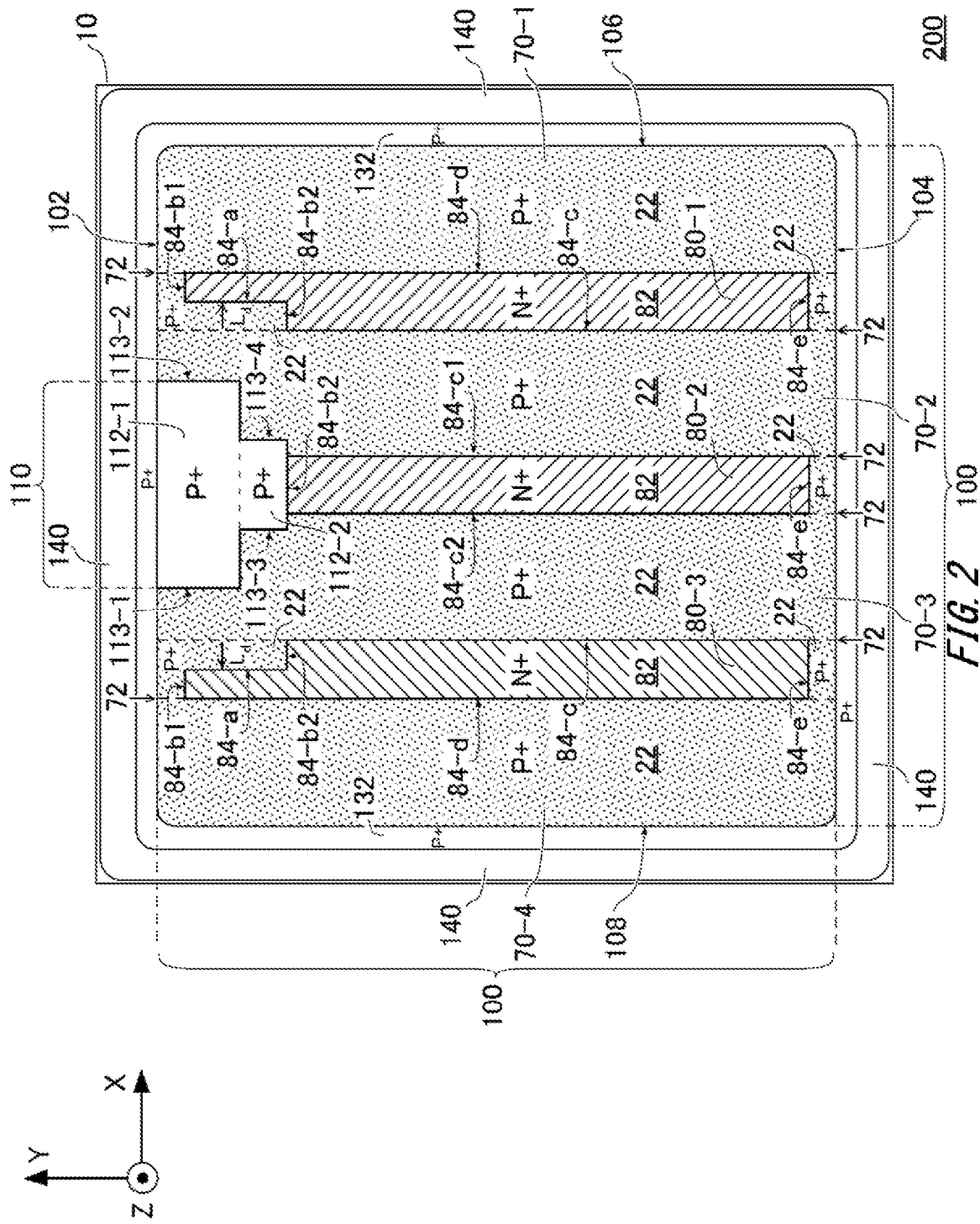
FIG. 2 shows the areas occupied by collector regions 22 and cathode regions 82 in the semiconductor device 200.

FIG. 2 shows the areas occupied by collector regions 22 and cathode regions 82 in the semiconductor device 200. As for the gate runner region 130, the gate runner portion 134 is not shown and only the gate runner well region 132 is shown.

In the present embodiment, the IGBT regions 70 each have the P+ type collector region 22 that is provided in the lower-surface-side portion of the semiconductor substrate 10. Here, the lower-surface-side portion means, for example, the lower half of the semiconductor substrate 10. In FIG. 2, the hatching indicates the areas occupied by the collector regions 22 in the active region 100. Note that the collector regions 22 may be provided beyond the active region 100 and cover the entire lower surface of the semiconductor substrate 10.

In the present embodiment, the IGBT regions 70 are positioned within the active region 100 and include therein transistors such as MOS gate structures. In the IGBT regions 70, the collector regions 22 are provided in the lower-surface-side portion of the semiconductor substrate 10. In the IGBT regions 70, unit structures, each of which is made up by an N+ type emitter region and a P+ type contact region, may be regularly arranged on the upper surface of the semiconductor substrate 10. For example, the emitter and contact regions are alternately arranged to be next to each other in the Y-axis direction in the IGBT regions 70.

In the present embodiment, in the IGBT regions 70, transistors such as MOS gate structures may be regularly and repeatedly arranged in the semiconductor substrate 10 on the upper-surface side thereof. When the IGBT regions 70 and the FWD regions 80 are alternately arranged next to each other in the X-axis direction, the collector regions 22 may be provided in the lower-surface-side portion of the semiconductor substrate 10 in the IGBT regions 70.

In the present embodiment, the FWD regions 80 each have the N+ type cathode region 82 that is provided in the lower-surface-side portion of the semiconductor substrate 10. In FIG. 2, a different hatching than the one indicative of the collector regions 22 indicates the areas occupied by the cathode regions 82 within the active region 100. In FIG. 2, the reference numeral 72 denotes the boundaries between the IGBT regions 70 and the FWD regions 80, and a portion of each boundary 72 that does not lie in the hatching indicative of the areas of the cathode regions 82 is indicated by the dotted lines. Within the area occupied by each FWD region 80, the collector region 22 is provided outside the cathode region 82 in the lower-surface-side portion, as in each IGBT region 70.

In the present embodiment, the FWD regions 80 are positioned within the active region 100 and include therein diodes such as free wheel diodes (FWDs). In the FWD regions 80, the N+ type cathode regions 82 are provided in the lower-surface-side portion of the semiconductor substrate 10. Note that, in the vicinity of the gate runner region 130, the edges 84 of each cathode region 82 that face each other in the Y-axis direction (that is, the Y-axis edges 84) may be positioned within the active region 100 in the Y-axis direction. In the present embodiment, the edges 84-*b* and 84-*e* of the cathode region 82 that face each other in the Y-axis direction are positioned back from the gate runner region 130 or back in the Y-axis direction in the vicinity of the gate runner region 130.

The edges 84-*b* and 84-*e* may be positioned back from the gate runner region 130 by a distance equal to or greater than the depth of the gate runner well region 132, preferably by a distance equal to or greater than the thickness of the semiconductor substrate 10. For example, the edges 84-*b* and 84-*e* are positioned back from the edges 102 and 104 by a distance of approximately 100 μm. Note that, as described above, the collector regions 22 are provided in the FWD regions 80 in such a manner as to fill the regions by which the cathode regions 82 are positioned back.

However, no transistors such as MOS gate structures are provided above the regions by which the cathode regions 82 are positioned back in the present embodiment. Therefore, even if the edges 84-*b* and 84-*e* of the cathode regions 82 that face each other in the Y-axis direction are positioned within the active region 100, the FWD regions 80 are considered herein to span across the entire Y-axis length of the active region 100. In other words, as used herein, the FWD region 80 is defined as continuously span from the edge 102 to the edge 104.

In addition, the edges 84 of each cathode region that face each other in the X-axis direction (that is, the X-axis edges 84) may be partly positioned back from the boundary 72 between the IGBT region 70 and the FWD region 80. In the present embodiment, an edge 84-*a* is a portion of the edge 84 at which the cathode region 82 ends in the X-axis direction. The edge 84-*a* is positioned on the side of the FWD region 80 with respect to the boundary 72 between the IGBT region 70 and the FWD region 80. Here, the edge 84-*a* is described as an example of a positioned-back edge. In the present embodiment, the edge 84-*a* is positioned back from the boundary 72 by a length $L_d$ into the FWD region 80. As a result of the edge 84-*a* being positioned back from the boundary 72, the edge 84-*b* at which the cathode region 82 ends in the Y-axis direction is divided into an edge 84-*b*1 and an edge 84-*b*2. In the present embodiment, the edges 84-*a*, 84-*b*1 and 84-*b*2 are found in the FWD regions 80-1 and 80-3 that are positioned on the left and right of the pad region 110. In the FWD regions 80-1 and 80-3, the edge 84-*a* that is positioned back may have a shorter Y-axis length than the edge 84-*c* that is not positioned back.

In the FWD regions 80 of the present embodiment, diodes such as free wheeling diodes may be provided in the semiconductor substrate 10 on the upper-surface side thereof. When the IGBT regions 70 and the FWD regions 80 are alternately arranged next to each other in the X-axis direction, the cathode regions 82 may be provided in the lower-surface-side portion of the semiconductor substrate 10 in the FWD regions 80.

Between the IGBT regions 70 and the FWD regions 80, boundary regions may be provided to prevent the interference therebetween. For example, the device structure of the boundary regions is different from both the device structure of the IGBT regions 70 and the device structure of the diodes such as free wheeling diodes of the FWD regions 80. The boundary regions may have an X-axis length of no less than 10 μm and no more than 100 μm, or no less than 50 μm and no more than 100 μm. Furthermore, the boundary regions may have a plurality of mesa portions. More preferably, the boundary regions may have no less than four and no more than 10 mesa portions. Each mesa portion may have an X-axis width of approximately 10 μm.

The pad well region 112 may have a plurality of edges 113 at which the pad well region 112 ends in the X-axis direction and that extend in the Y-axis direction. In the present embodiment, the pad well region 112-1 has an edge 113-1 and an edge 113-2. The pad well region 112-2 has an edge 113-3 and an edge 113-4.

The pad well region 112 may be in contact with two IGBT regions 70 and with one FWD region 80 that is sandwiched between the two IGBT regions 70. In the present embodiment, the pad well region 112 is in contact with IGBT regions 70-2 and 70-3 and with a FWD region 80-2. In the present embodiment, the edges 113-1 and 113-3 are in contact with the IGBT region 70-3. Likewise, the edges 113-2 and 113-4 are in contact with the IGBT region 70-2.

Here, the edge 113-1 is described as an example of a first edge of the pad well region 112, and the IGBT region 70-3 is described as an example of a first transistor region. Likewise, the edge 113-2 is described as an example of a second edge of the pad well region 112 and the IGBT region 70-2 is described as an example of a second transistor region that is differently positioned than the first transistor region. Since the pad well region 112-1 has a larger width than the pad well region 112-2, the edges 113-1 and 113-2 are more distant from the center in the X-axis direction than the edges 113-3 and 113-4.

The edges 113 of the pad well region 112 at which the pad well region 112 end in the X-axis direction may be in contact with the IGBT regions 70. Since the collector regions 22 are provided in the IGBT regions 70 in the lower-surface-side portion of the semiconductor substrate 10, the collector regions 22 may be positioned below the edges 113-1, 113-2, 113-3 and 113-4 of the pad well region 112.

In the present embodiment, the FWD regions 80-1 and 80-3 are not in contact with the pad well region 112. The FWD regions 80-1 and 80-3 are positioned opposite the pad well region 112 in the X-axis direction with the IGBT regions 70-2 and 70-3, which are in contact with the pad well regions 112, being sandwiched therebetween. The edges 84-a of the FWD regions 80-1 and 80-3 oppose the edges 113 of the pad well region 112 in the X-axis direction and extend in the Y-axis direction. The edge 84-a of the FWD region 80-1 is positioned opposite the edges 113 of the pad well region 112 with the boundary 72 between the IGBT region 70-2 and the FWD region 80-1 being sandwiched therebetween, and the edge 84-a of the FWD region 80-3 is positioned opposite the edges 113 of the pad well region 112 with the boundary 72 between the IGBT region 70-2 and the FWD region 80-3 being sandwiched therebetween.

In the present embodiment, each cathode region 82 has a pair of edges 84 opposing each other in the Y-axis direction (the set of the edges 84-b1 and 84-b2 and the edge 84-e) and a pair of edges 84 opposing each other in the X-axis direction (the set of the edge 84-c and the edge 84-d). Note that the cathode region 82 in the FWD region 80-2, which is in contact with the pad region 110 in the Y-axis direction has a pair of edges 84-c1 and 84-c2 opposing each other in the X-axis direction. In the present embodiment, the edge 84-b1 of the cathode region 82 of the FWD region 80-1 is positioned at the same position in the Y-axis direction as the edge 84-b1 of the cathode region 82 of the FWD region 80-3. Likewise, the edge 84-b2 of the cathode region 82 of the FWD region 80-1, the edge 84-b2 of the cathode region 82 of the FWD region 80-2 and the edge 84-b2 of the cathode region 82 of the FWD region 80-3 are positioned at the same position in the Y-axis direction. Likewise, the edges 84-e of the cathode regions 82 of the FWD regions 80-1, 80-2 and 80-3 are are positioned at the same position in the Y-axis direction.

The above-described chip may have an opposing arm including another chip. While the ON voltage is applied to the gate conductive portions of the IGBT regions 70 of the RC-IGBT in the other chip (that is, while the IGBT regions 70 of the opposing arm are turned on), no current flows though the FWD regions 80 of the above-described chip. While the IGBT regions 70 of the RC-IGBT of the other chip are turned off, however, current may flow through the FWD regions 80 of the above-described chip. For example, free wheeling current flows from the emitter electrode to the collector electrode in the FWD regions 80 of the chip. After this, reverse recovery current flows from the collector electrode to the emitter electrode (that is, the free wheeling current flows in the reverse direction). Following this, the free wheeling current decreases so as to gradually approach zero.

In the vicinity of the pad well region 112, the free wheeling current flowing through the FWD regions 80 may cause carriers (in the present example, holes) to accumulate. The holes accumulating in the vicinity of the pad well region 112 flow from the pad well region 112 to the FWD regions 80 when reverse recovery current flows. As a result, the holes concentrate particularly in the FWD regions 80 that are positioned in the vicinity of the pad well region 112, which is likely result in electric field concentration. In other words, during reverse recovery, the FWD regions 80 in the vicinity of the pad well region 112 may break down. This may be referred to as reverse recovery breakdown.

To address this issue, the collector regions 22 are provided below the edges 113 of the pad well region 112 as described above in the present embodiment. In other words, the pad well region 112 and the FWD regions are spaced away from each other at least by a distance equal to the X-axis width of one IGBT region 70. In this way, when compared with the case where the edges 113 of the pad well region 112 are in contact with the FWD regions 80, the electric field concentration can be reduced in the FWD regions 80, which can lower the risk of reverse recovery breakdown in the FWD regions 80.

Furthermore, in the present embodiment, the cathode regions 82 are spaced away from the pad well region 112 by a distance equal to or greater than the X-axis width of one IGBT region 70. According to the present embodiment, the edge 84-a of the cathode region 82 of the FWD region 80-1 is positioned back from the boundary 72 into the FWD region 80-1 in the X-axis direction by the length $L_d$. Likewise, the edge 84-a of the cathode region 82 of the FWD region 80-3 is positioned back from the boundary 72 into the FWD region 80-3 in the X-axis direction by the length $L_d$. In this way, when compared with the case where the edge 84-a is positioned at the same position in the X-axis direction as the edge 84-c in the X-axis direction, the electric field concentration can be further reduced at the edges 84 of the FWD regions 80 that face the pad region 110, which can further lower the risk of reverse recovery breakdown in the FWD regions 80.

The edges 84-a may be spaced away from the edges 113 of the pad well region 112 by a distance equal to or greater than the thickness of the semiconductor substrate 10. The edge 84-a may be spaced away from the edge 113-1 by a distance equal to or greater than the thickness of the semiconductor substrate 10. Likewise, the edge 84-a may be spaced away from the edge 113-3 by a distance equal to or greater than the thickness of the semiconductor substrate 10. The spacing distance between the edge 84-a and the edge 113-2 and the spacing distance between the edge 84-a and the edge 113-4 may be also equal to or greater than the thickness of the semiconductor substrate 10. The edge 84-a may be spaced away from the boundary 72 by a distance of no less than 90 μm and no more than 110 μm. Here, the boundary 72 is positioned at the same position in the X-axis direction as the not-positioned-back edge 84-c in the X-axis direction. For example, the edge 84-a is spaced away from the boundary 72 by 100 μm. The above-described positioned-back edge 84-a can further lower the risk of reverse recovery breakdown in the FWD regions 80 and, at the same time, prevent excessive reduction in the area of the cathode regions 82.

Figure 3:
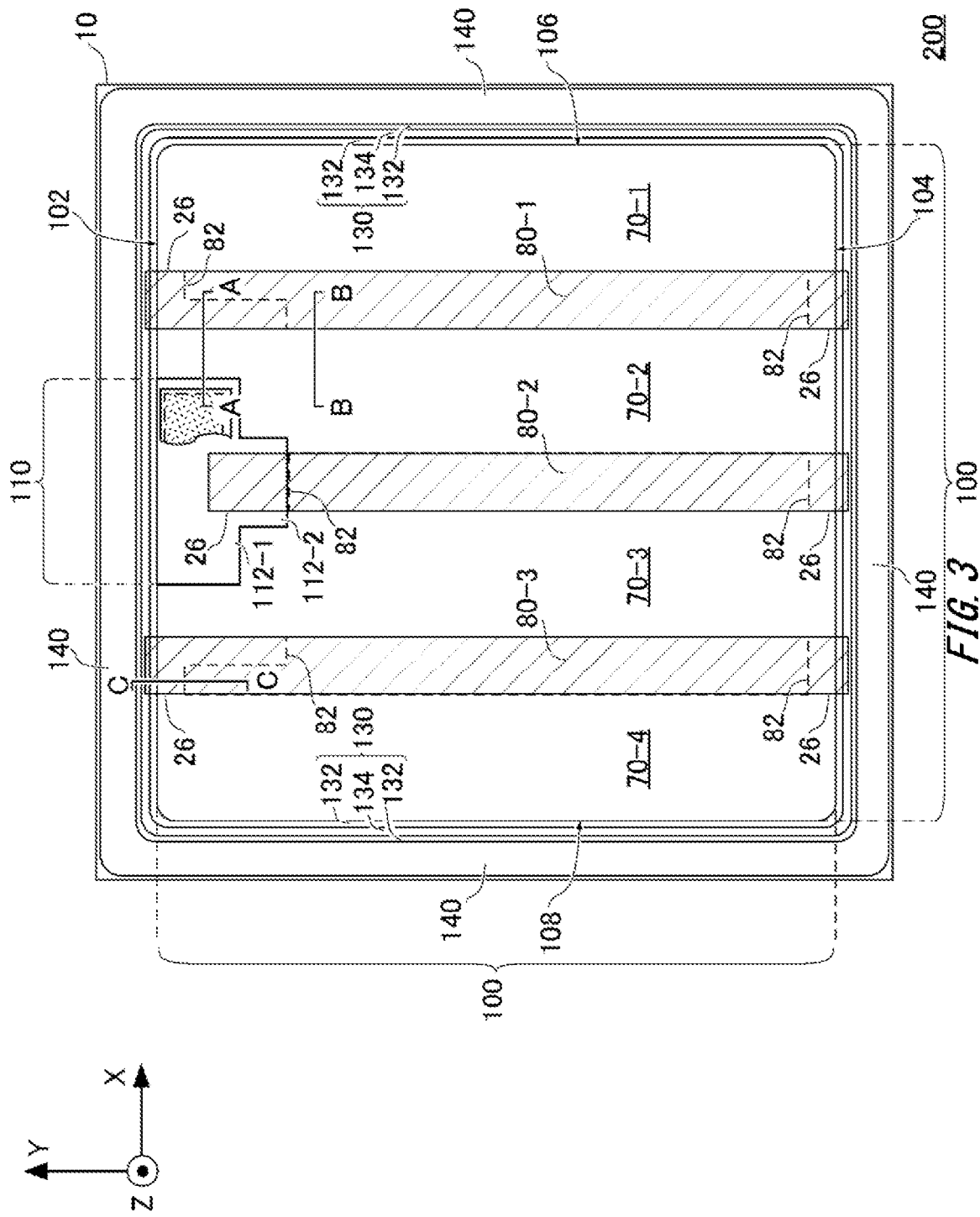
FIG. 3 shows the areas occupied by lifetime killer regions 26 and the cathode regions 82 in the semiconductor device 200.

FIG. 3 shows the areas occupied by lifetime killer regions 26 and the cathode regions 82 in the semiconductor device 200. FIG. 3 uses the hatching to indicate the lifetime killer region 26 and uses the dotted lines to indicate the areas occupied by the cathode regions 82. Note that some of the components including the gate pad 116 are not shown to facilitate the understanding but the cathode regions 82 are positioned lower than the gate pad 116 and the like. The semiconductor substrate 10 may include the lifetime killer regions 26 between the upper surface of the semiconductor substrate 10 and the collector and cathode regions 22 and 82. The lifetime killer regions 26 may be positioned closer to the upper surface than the middle position between the upper surface and the lower surface of the semiconductor substrate 10.

The lifetime killer regions 26 may include point defects (vacancies, divacancies, dangling bonds and the like) that are formed within the semiconductor substrate 10 by introducing impurities such as helium (He) therein. Alternatively, the lifetime killer regions 26 may include the impurities themselves that are introduced to form the point defects. The lifetime killer regions 26 may include recombination centers of the carriers that are formed in the semiconductor substrate 10 by at least one of the point defects and the impurities.

The lifetime killer regions 26 may be provided in correspondence with the FWD regions 80. In the present embodiment, the lifetime killer regions 26 at least cover the FWD regions 80 entirely when seen from above. This ensures that the lifetime killer regions 26 are positioned above the edges 84-a of the cathode regions 82. The lifetime killer regions 26 can reduce the number of holes that can reach the FWD regions 80 during reverse recovery. This can further reduce reverse recovery breakdown in the FWD regions 80.

When the semiconductor substrate 10 is seen from above, the lifetime killer regions 26 may extend from the edges 102 and 104 to a predetermined position in the gate runner well region 132. In the present embodiment, when seen from above, the lifetime killer regions 26 extend over the FWD regions 80, additionally beyond the Y-axis edges of the gate runner well region 132, which are in contact with the FWD regions 80, and finally reach the Y-axis center of the gate runner well region 132. This can further reduce the number of holes that can flow from the gate runner well region 132 and reach the FWD regions 80 during reverse recovery.

In the present embodiment, when seen from above, the lifetime killer region 26 extends over the FWD region 80-2, additionally beyond the Y-axis edge of the pad well region 112-2, which is in contact with the FWD region 80-2, and finally reaches the pad well region 112-1. This can further reduce the number of holes that can flow from the pad well region 112 and reach the FWD region 80-2 during reverse recovery.

In a different embodiment, the recombination center concentration may be set higher in the portions of the lifetime killer regions 26 that overlap the gate runner well region 132 and the pad well region 112 than in the FWD regions 80. For example, after helium is introduced into the areas occupied by the lifetime killer regions 26 shown in FIG. 3, helium is additionally introduced only into the portions of the lifetime killer regions 26 that overlap the gate runner well region 132 and the pad well region 112. The recombination center concentration may be raised in the limited portions by injecting helium into the limited portions in more than one step. This can further reduce the number of holes that can reach the FWD regions 80 during reverse recovery.

Figure 4:
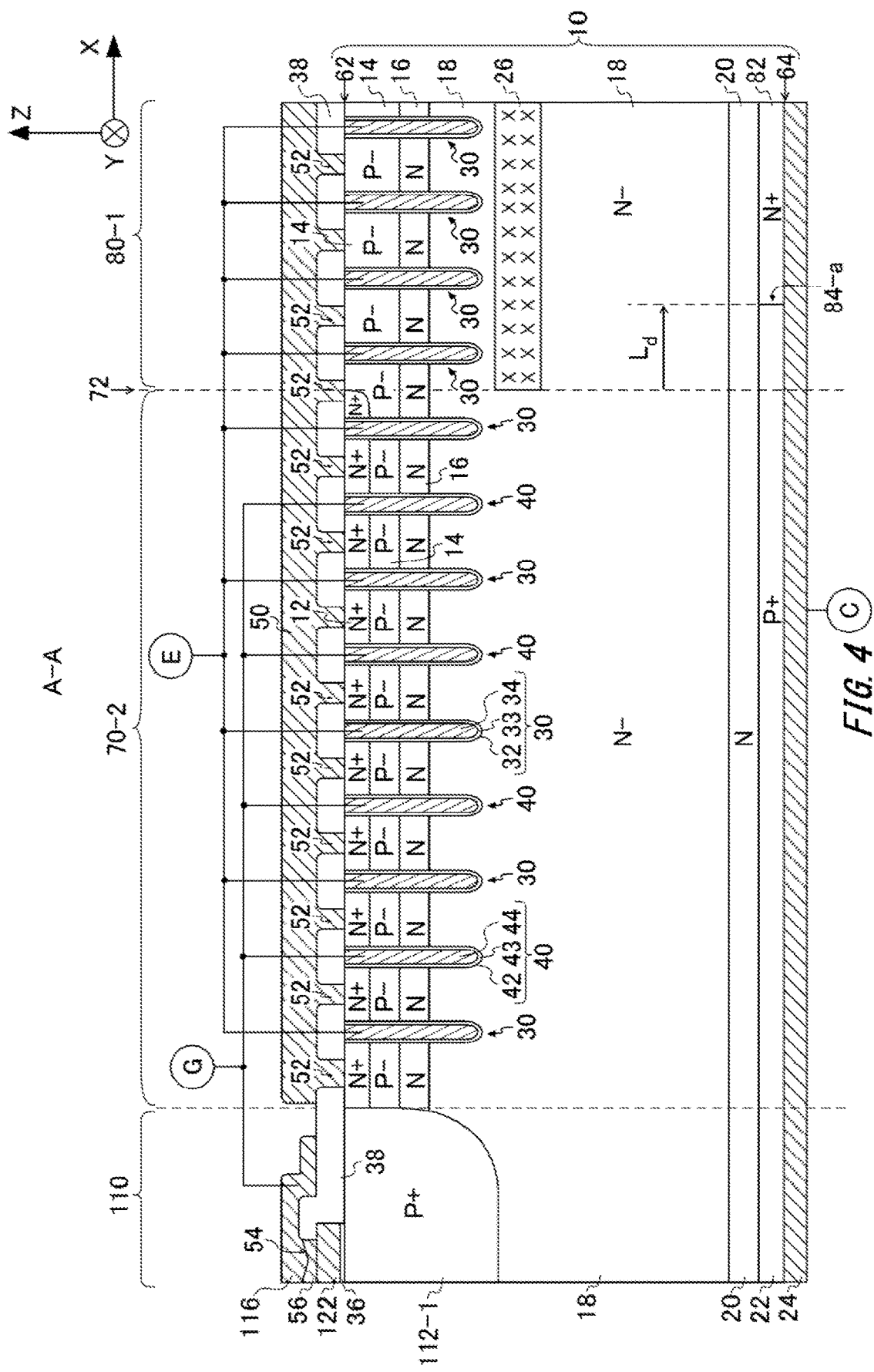
FIG. 4 shows the cross-section taken along the line A-A indicated in FIG. 3.

FIG. 4 shows the cross-section taken along the line A-A indicated in FIG. 3. The cross-section taken along the line A-A passes through the pad region 110, the IGBT region 70-2 and the FWD region 80-1 and is parallel to the X-Z plane. The semiconductor substrate 10 has an upper surface 62 and a lower surface 64. In the present embodiment, the semiconductor substrate 10 includes the pad well region 112-1, an N+ type emitter region 12, a P− type base region 14, an N type accumulation region 16, an N− type drift region 18, dummy trench portions 30, gate trench portions 40, the lifetime killer region 26, an N type field stop region (hereinafter, referred to as the FS region 20), the P+ type collector region 22, and the N+ type cathode region 82.

According to the A-A cross-section, the pad region 110 includes an insulating film 36 on the upper surface 62 and a polysilicon layer 120 on the insulating film 36. The polysilicon layer 120 may be formed in the same manner as the polysilicon layer of the gate runner portion 134. The insulating film 36 may be made of silicon dioxide ($SiO_2$) obtained by thermally oxidizing the silicon substrate. The polysilicon layer 120 may be electrically connected to the gate pad 116 via an opening 54 in an interlayer dielectric film 38. In the opening 54, a plug 56 made of tungsten (W) or the like may be provided. The interlayer dielectric film 36 may be made of one or more types of silicon dioxide, BPSG (Boro-Phospho Silicate Glass), PSG (Phosphorus Silicate Glass) and BSG (Borosilicate Glass).

According to the A-A cross-section, the emitter region 12, the base region 14, the accumulation region 16 and the drift region 18 are arranged in the stated order in the IGBT region 70-2 with the emitter region 12 being positioned the closest to the upper surface 62. The dummy trench portions 30 and the gate trench portions 40 are spaced away from each other by a predetermined spacing in the X-axis direction. The dummy trench portions 30 and the gate trench portions 40 may penetrate through the base region 14 and the accumulation region 16 and reach the drift region 18. As used herein, the term "trench portions" may collectively refer to the dummy trench portions 30 and the gate trench portions 40.

Each dummy trench portion 30 includes a dummy trench 32, a dummy trench insulating film 33 and a dummy trench conductive portion 34. The dummy trench 32 may be formed by etching the semiconductor substrate 10 until a predetermined depth is achieved from the upper surface 62. The dummy trench insulating film 33 may be in contact with the inner wall of the dummy trench 32. The dummy trench insulating film 33 may be formed by oxidizing or nitriding the semiconductor inner wall of the dummy trench 32. The dummy trench conductive portion 34 may be in contact with the dummy trench insulating film 33 and positioned inside the dummy trench insulating film 33. The dummy trench insulating film 33 may insulate the dummy trench conductive portion 34 and the semiconductor substrate 10 from each other. In the present embodiment, the dummy trench insulating film 33 is made of silicon dioxide obtained by thermal oxidization, and the dummy trench conductive portion 34 is made of a conductive material such as polysilicon.

The gate trench portion 40 includes a gate trench 42, a gate insulating film 43 and a gate conductive portion 44. The gate trench 42, the gate insulating film 43 and the gate conductive portion 44 may be formed in the same manner as the dummy trench 32, the dummy trench insulating film 33 and the dummy trench conductive portion 34. Applying a predetermined gate voltage to the gate conductive portion 44 may create a channel in a partial region of the base region 14 that is in the vicinity of its interface in contact with the gate trench 42. This may turn on the IGBT region 70.

The accumulation region 16 may be positioned between the base region 14 and the bottoms of the trench portions in the depth direction. The accumulation region 16 may be capable of temporarily accumulating the holes introduced from the collector region 22 toward the upper surface 62. This can increase the carrier injection enhancement (IE) effects, so that a lower ON voltage ($V_{on}$) can be achieved in the IGBT region 70 when compared with the case where no accumulation region 16 is provided.

The interlayer dielectric film 38 may be provided on the upper surface 62. The interlayer dielectric film 38 may include a plurality of openings 52 positioned on the upper surface 62 in the active region 100. The openings 52 may extend in the Y-axis direction and be spaced away from each other in the X-axis direction. The emitter electrode 50 may be electrically connected to the emitter region 12 (and a P+ type contact region 15, which will be described later) through the openings 52. The emitter electrode 50 may be made of the same material as the above-described gate metal layer. The emitter electrode 50 may include a region made of aluminum or the like and a barrier metal that is formed below the region and made of titanium (Ti), a titanium compound or the like. In the openings 52, a plug made of tungsten or the like may be provided. The openings 52 in the interlayer dielectric film 38 is described as an example of a contact portion.

According to the A-A cross-section, the collector region 22 and the FS region 20 are arranged in the stated order in the IGBT region 70-2 with the collector region 22 being positioned closest to the lower surface 64. The FS region 20 may be positioned between the drift region 18 and the collector region 22. The FS region 20 may be capable of preventing a depletion layer from reaching the collector region 22. Here, the depletion layer may expand from the bottom portion of the base region 14 to the lower surface 64 when the semiconductor device 200 is turned off. The FS region 20 may have one or more peaks in the N type doping concentration distribution that are arranged next to each other in the Z-axis direction.

According to the A-A cross-section, the base region 14, the accumulation region 16 and the drift region 18 are arranged in the stated order in the FWD region 80-1 with the base region 14 being positioned the closest to the upper surface 62. In the FWD region 80-1, no gate trench portion 40 is provided. In the FWD region 80-1, the dummy trench portions 30 are provided and spaced away from each other by a predetermined spacing in the X-axis direction. Note that, as described above, the lifetime killer region 26 is provided in the FWD region 80-1 and extends in the X-axis direction so as to reach the boundary 72 between the IGBT region 70-2 and the FWD region 80-1.

According to the A-A cross-section, the cathode and collector regions 82 and 22 and the FS region 20 are arranged in the stated order in the FWD region 80-1 with the cathode and collector regions 82 and 22 being positioned the closest to the lower surface 64. As described above, the edge 84-*a* of the cathode region 82 is positioned back from the boundary 72 by the length $L_d$ in the present embodiment. The semiconductor device 200 includes the collector electrode 24 in contact with the lower surface 64. The collector electrode 24 may be in contact with the entire lower surface 64 of the semiconductor substrate 10. The collector electrode 24 may be made of the same conductive material as the emitter electrode, for example, a metal.

Figure 5:
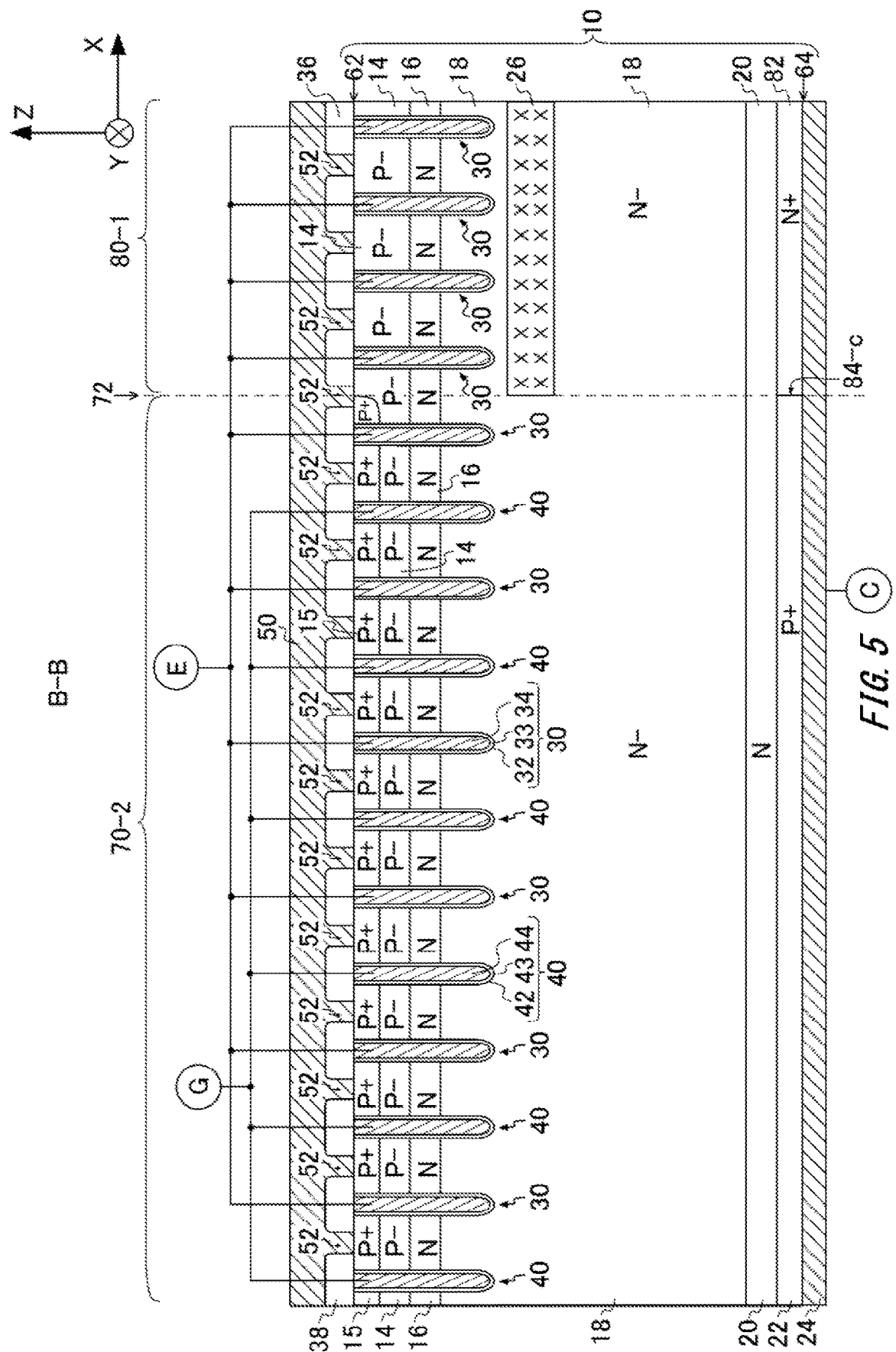
FIG. 5 shows the cross-section taken along the line B-B indicated in FIG. 3.

FIG. 5 shows the cross-section taken along the line B-B indicated in FIG. 3. The B-B cross-section passes through the IGBT region 70-2 and the FWD region 80-1 and is parallel to the X-Z plane. The B-B cross-section passes through one of the contact regions 15, which is selected from the emitter regions 12 and the contact regions 15 that are alternately arranged next to each other in the Y-axis direction in the IGBT region 70. According to the B-B cross-section, the edge 84-*c* of the cathode region 82 is at the same position as the boundary 72 in the X-axis direction.

Figure 6:
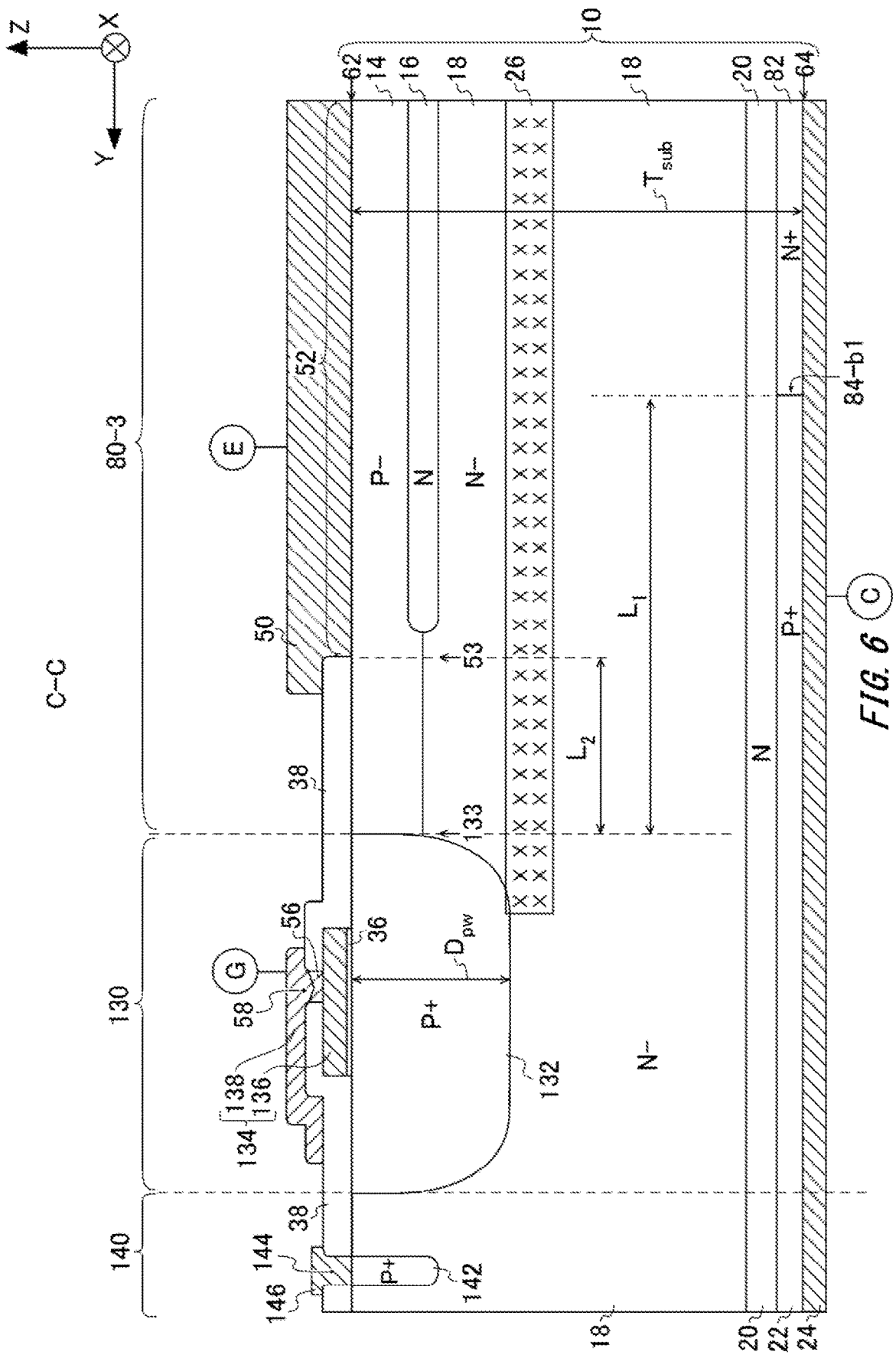
FIG. 6 shows the cross-section taken along the line C-C indicated in FIG. 3.

FIG. 6 shows the cross-section taken along the line C-C indicated in FIG. 3. The C-C cross-section passes through the opening 52 in the FWD region 80-3, the gate runner region 130 and the edge termination region 140 and is parallel to the Y-Z plane. To be more specific, the C-C cross-section passes through the edge 84-*b*1 (see FIG. 2) of the cathode region 82 of the FWD region 80-3. The gate runner region 130 includes the gate runner well region 132 having a predetermined depth from the upper surface 62. In the present embodiment, a depth $D_{pw}$ denotes the depth from the upper surface 62 to the bottom of the gate runner well region 132. In addition, a thickness $T_{sub}$ denotes the thickness of the semiconductor substrate 10 extending from the upper surface 62 to the lower surface 64.

The gate runner region 130 includes the insulating film 36, the gate runner portion 134 and the interlayer dielectric film 38. In the present embodiment, the gate runner portion 134 includes a polysilicon layer 136 and a gate metal layer 138 sandwiching the interlayer dielectric film 38 therebetween. The polysilicon layer 136 may be formed in the same manner as the polysilicon layer 120 in the pad region 110. The gate metal layer 138 may be formed in the same manner as the gate resistance measuring pad 118 and the gate pad 116 in the pad region 110.

The polysilicon layer 136 and the gate metal layer 138 may be electrically connected to each other via an opening 58 in the interlayer dielectric film 38. In the opening 58, the above-described plug may be provided. Since the C-C cross-section passes through the FWD region 80-3, FIG. 4 does not show the gate trench portions 40. The cross-section that is parallel to the C-C cross-section and passes through the gate trench portion 40 in the IGBT region 70 may show that the gate metal layer 138 is electrically connected to the gate conductive portion 44.

The gate runner well region 132 has an edge 133 that is in contact with the FWD region 80 in the Y-axis direction. In the present embodiment, the edge 133 forms the boundary between the active region 100 and the gate runner region 130. The edge 133 of the gate runner well region 132 opposes in the Y-axis direction the edge 84-*b*1 of the cathode region 82. When the edge 133 and the edge 84-*b*1 are imaginarily projected onto the upper surface 62 of the semiconductor substrate 10, a first distance $L_1$ denotes the shortest distance between the edge 133 and the edge 84-*b*1. Note that the C-C cross-section uses the extension lines (the dotted lines) parallel to the Z-axis direction to show the imaginary projection.

In the present embodiment, the edge 84-*b*1 of the cathode region 82 is positioned backs and positioned inside the edge 133 of the gate runner well region 132. Therefore, the effective area of the FWD region 80-3 that can actually serve as a FWD is smaller than the case where the edge 84-*b*1 is at the same position as the edge 133 in the Y-axis direction. The first distance $L_1$, which denotes the shortest distance between the edge 133 and the edge 84-*b*1, may be larger than the depth $D_{pw}$. With such configurations, the reduction in the effective area of the FWD region 80-3 that can serve as a FWD can result in the reduction in the quantity of the holes that are introduced into the drift region 18 from the base region 14 due to the free wheeling current. In the FWD region 80, the base region 14 serves as the anode of the FWD. Accordingly, the above-described configurations can also also reduce the quantity of the holes accumulating in the vicinity of the gate runner well region 132.

In addition, a second distance $L_2$ denotes the shortest distance between the edge 133 of the gate runner well region 132 and an edge 53 of at least one opening 52 in the present embodiment. When the edge 133 and the edge 53, which oppose each other in the Y-axis direction, are imaginarily projected onto the upper surface 62 of the semiconductor substrate 10, the first distance $L_1$ may be larger than the second distance $L_2$.

Note that, however, a too large first distance $L_1$ results in large conduction loss in the FWD region 80. Accordingly, the first distance $L_1$ may be smaller than the thickness $T_{sub}$. This feature makes it possible to reduce the quantity of the holes accumulating in the vicinity of the gate runner well region 132 and, at the same time, to lower the conduction loss in the FWD region 80 since excessive reduction in the area of the cathode region 82 can be prevented.

The holes that have accumulated in the vicinity of the gate runner well region 132 are likely to concentrate in the vicinity of the edge 53 of the opening 52 during reverse recovery. The distance $L_2$ may be no less than 40% and no more than 60% of the distance $L_1$. For example, the distance $L_2$ is no less than 10 µm and no more than 20 µm. When there is a sufficient distance between the edge 133 and the edge 53 as described above, excessive carrier injection from the vicinity of the gate runner well region 132 can be reduced when compared with the case where the distance $L_2=0$. In addition, the electric field concentration can be reduced in the vicinity of the edge 53 of the opening 52. This can improve the breakdown withstand capability of the semiconductor device 200 during reverse recovery.

In the present embodiment, the edge termination region 140 includes a P+ type guard ring 142 and a metal layer 146 that is connected to the guard ring 142 via an opening 144 in the interlayer dielectric film 38. The metal layer 146 may serve as a field plate. The guard ring 142 and the metal layer 146 may be shaped like a rectangular ring, like the gate runner region 130.

Figure 7:
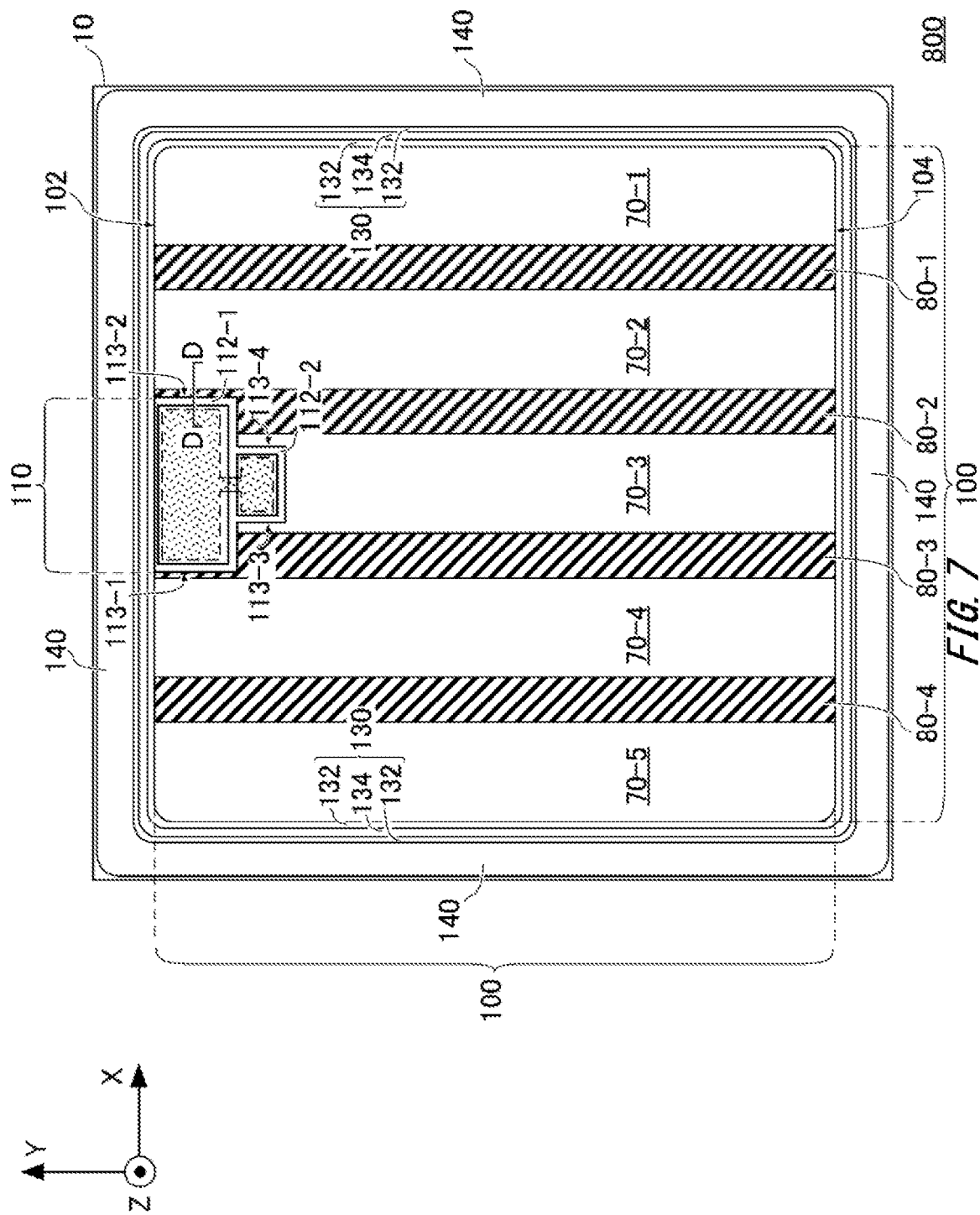
FIG. 7 is a top view showing a semiconductor device 800 relating to a comparative example.

FIG. 7 is a top view showing a semiconductor device 800 relating to a comparative example. The semiconductor device 800 includes five IGBT regions 70 (70-1 to 70-5) and four FWD regions 80 (80-1 to 80-4). The pad well region 112 is in contact with the IGBT region 70-3 in the Y-axis direction. The edge 113-1 of the pad well region 112-1 is in contact with the FWD region 80-3 and the edge 113-2 is in contact with the FWD region 80-2. The comparative example is different from the first embodiment mainly in terms of these features.

Figure 8:
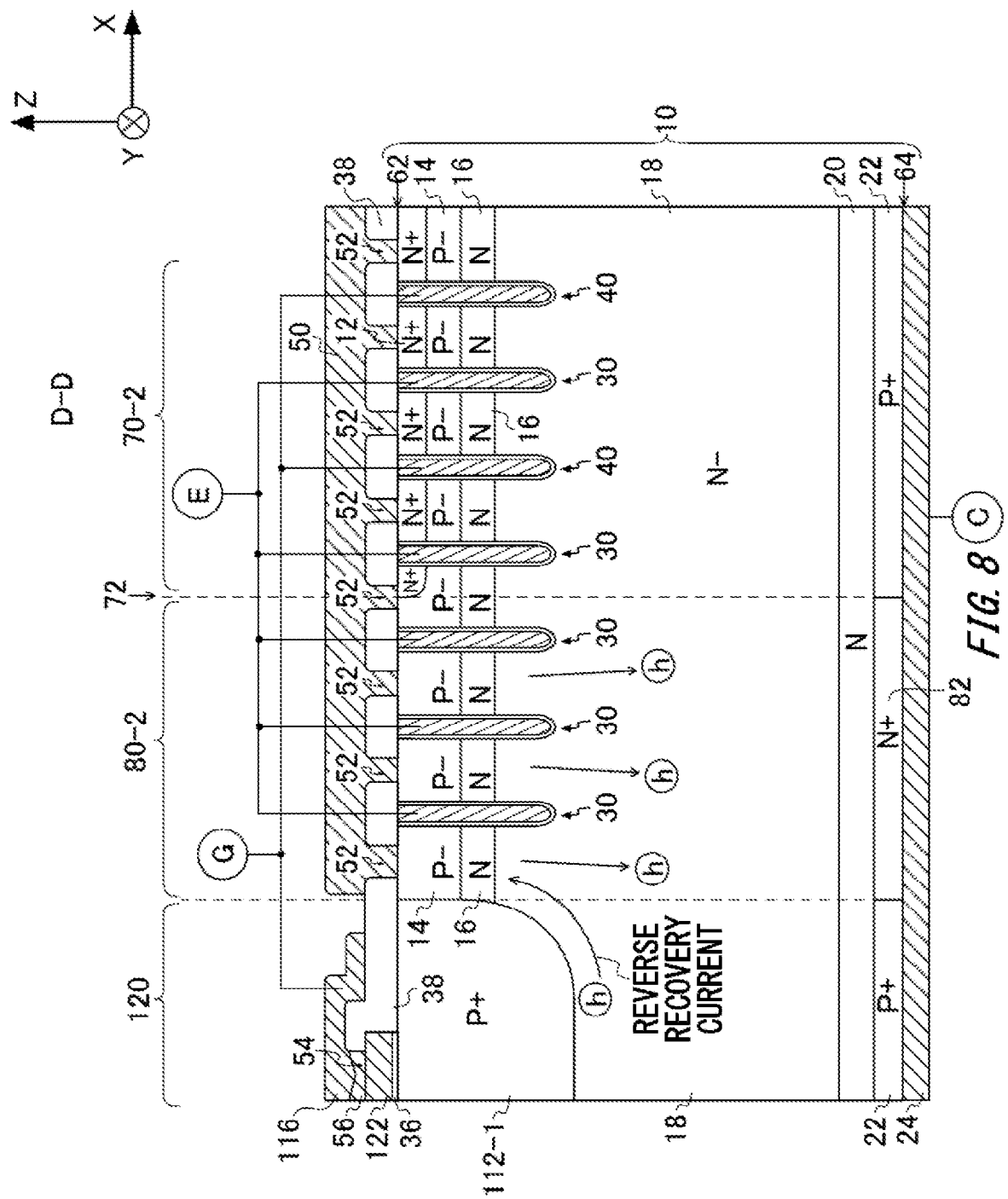
FIG. 8 shows a cross-section taken along the line D-D indicated in FIG. 7.

FIG. 8 shows a cross-section taken along the line D-D indicated in FIG. 7. The D-D cross-section passes through the pad region 110, the FWD region 80-2 and the IGBT region 70-2 and is parallel to the X-Z plane. In the D-D cross-section, the letter "h" denotes the holes. When free wheeling current flows in the FWD region 80 from the base region 14 to the cathode region 82, the holes may be introduced into the drift region 18. On the other hand, when reverse recovery current flows in the FWD region 80 from the cathode region 82 to the base region 14, the holes may be introduced into the base region 14 from the vicinity of the pad well region 112.

According to the comparative example, the pad region 110 is in contact with the FWD region 80-2. This causes more intensive electric field concentration in the FWD region 80-2 than in the first embodiment, which is more likely to cause reverse recovery breakdown in the FWD region 80-2.

Figure 9:
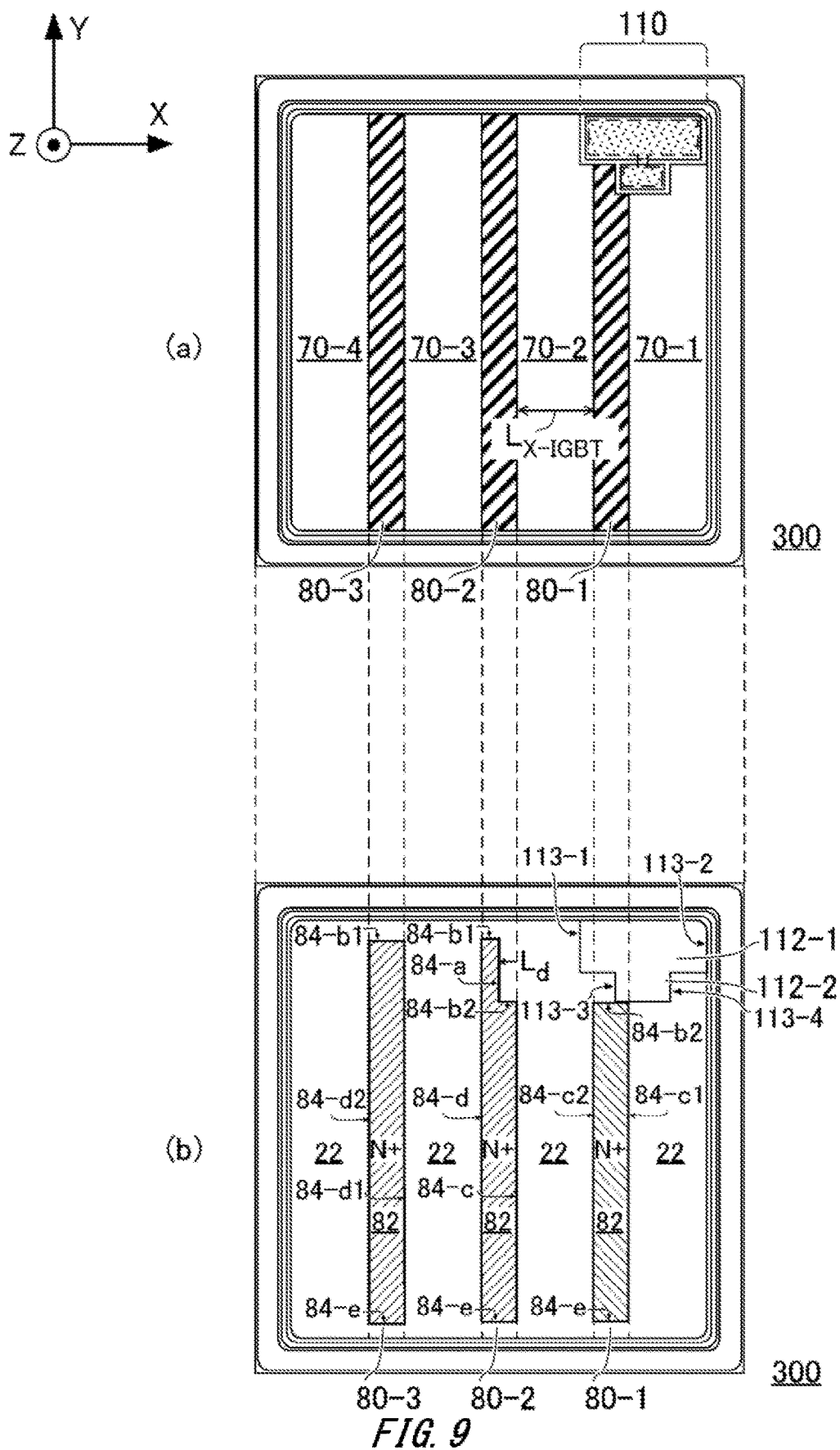
FIG. 9 includes views (a) and (b) showing a semiconductor device 300 relating to a second embodiment.

FIG. 9 includes views (a) and (b) showing a semiconductor device 300 relating to a second embodiment. In FIG. 9, the view (a) is similar to FIG. 1 and shows the top view of the semiconductor device 300. In FIG. 9, the view (b) is similar to FIG. 2 and shows the areas occupied by the collector regions 22 and the cathode regions 82 in the semiconductor device 300. According to the second embodiment, the pad region 110 is in contact with the corner of the active region 100. Correspondingly to this feature, the pad well region 112 is in contact with the corner of the active region 100. The second embodiment is different from the first embodiment mainly in terms of this feature.

According to the first embodiment, the FWD region 80-2 is the closest to the pad well region 112, and the FWD regions 80-1 and 80-3 are the second closest. In the first embodiment, the distance between the FWD region 80-1 and the pad region 110 and the distance between the FWD region 80-3 and the pad region 110 are both shorter than the X-axis length ($L_{X\text{-}IGBT}$) of one IGBT region 70. According to the second embodiment, on the other hand, one of the three FWD regions (80-3) can be spaced away from the pad region 110 by a distance equal to or greater than the length $L_{X\text{-}IGBT}$. In addition, the X-axis distance between the second closest FWD region 80-2 and the pad region 110 can be longer than in the first embodiment. In this manner, the second embodiment can further lower the risk of reverse recovery breakdown in the FWD regions 80.

In the present embodiment, the pad well region 112 is in contact with the IGBT regions 70-1 and 70-2 and also with the FWD region 80-1. The edges 84, opposing each other in the X-axis direction, of the cathode region corresponding to the FWD region 80-2 includes the edge 84-a, which is described as an example of a positioned-back edge. In the present embodiment, the edge 84-a is also positioned back from the boundary 72 into the FWD region 80 by the length $L_d$.

In the present embodiment, the FWD regions 80-2 and 80-3 are not in contact with the pad well region 112. The FWD regions 80-2 and 80-3 are positioned opposite the pad well region 112 in the X-axis direction with the IGBT regions 70-1 and 70-2, which are in contact with the pad well region 112, being sandwiched therebetween. The edge 84-a opposes the edge 113 of the pad well region 112 in the X-axis direction and extends in the Y-axis direction. The edge 84-a is positioned opposite the edge 113 of the pad well region 112 with the boundary 72 between the IGBT region 70-2 and the FWD region 80-1 being sandwiched therebetween.

The edge 84-a of the cathode region 82 in the FWD region 80-2 may be positioned back in the X-axis direction from the boundary 72 toward the FWD region 80-3 by the length $L_d$. The length $L_d$ may be equal to or greater than the thickness of the semiconductor substrate 10, more specifically, equal to or greater than 90 µm. In the present embodiment, since the FWD region 80-3 can be spaced away from the pad region 110 by a length equal to or greater than the length $L_{X\text{-}IGBT}$, the cathode region 82 corresponding to the FWD region 80-3 can have a larger area than in the first embodiment. In this way, the second embodiment can prevent excessive reduction in the area of the cathode region 82. Accordingly, the second embodiment can achieve reduced conduction loss in the FWD region 80 when compared with the first embodiment. Note that the semiconductor device 300 of the present embodiment may also include lifetime killer regions 26 as shown in FIG. 3 showing the first embodiment.

Figure 10:
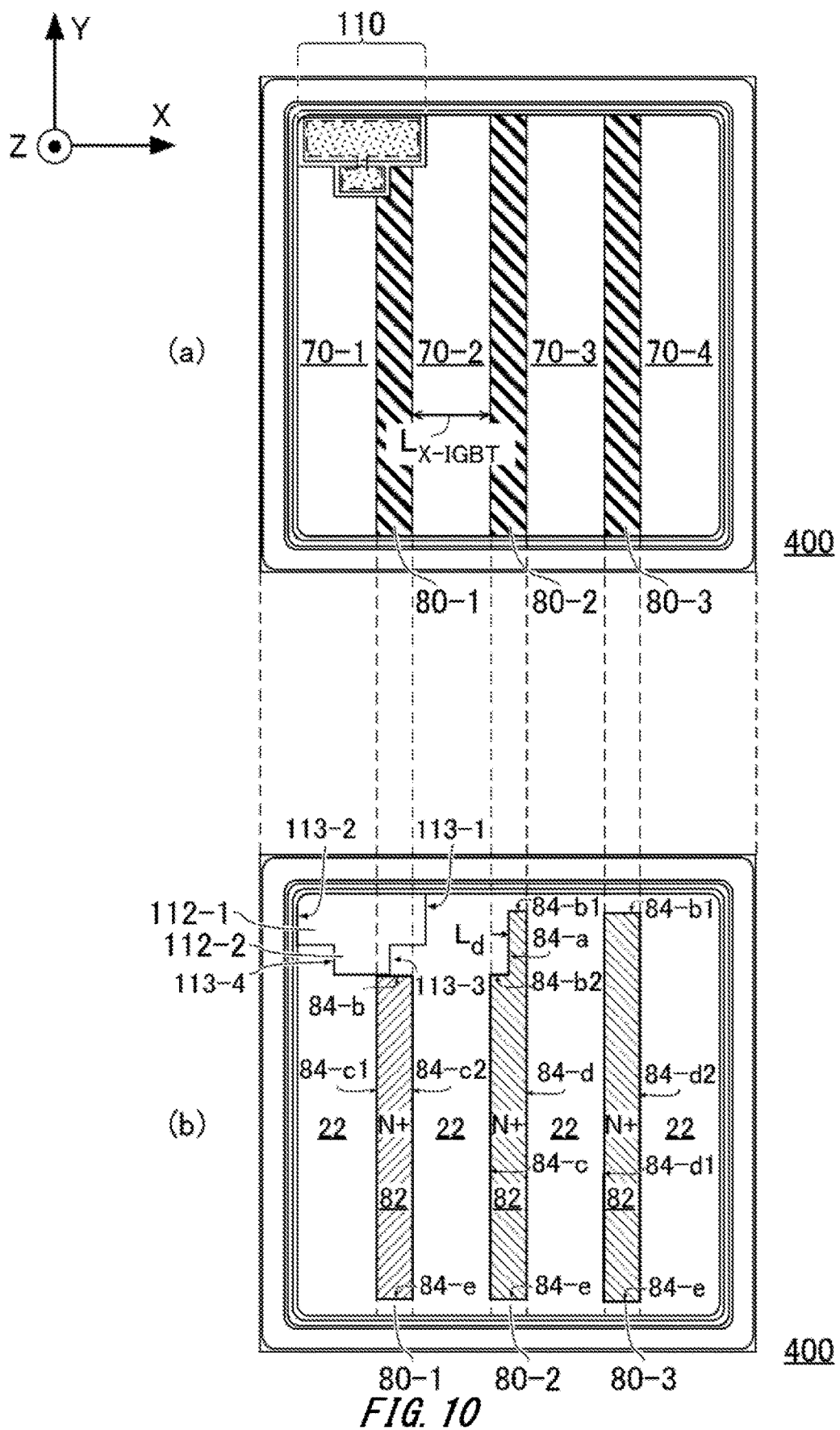
FIG. 10 includes views (a) and (b) showing a semiconductor device 400 relating to a first modification example of the second embodiment.

FIG. 10 includes views (a) and (b) showing a semiconductor device 400 relating to a first modification example of the second embodiment. In FIG. 10, the view (a) is similar to FIG. 1 and shows a top view of the semiconductor device 400. In FIG. 10, the view (b) is similar to FIG. 2 and shows the areas occupied by the collector regions 22 and the cathode regions 82 in the semiconductor device 400. The position of the pad region 110 in the semiconductor device 400 is reflectionally symmetrical with the position of the pad region 110 in the semiconductor device 300 with respect to the Y axis. The first modification example can also produce similar advantageous effects to the second embodiment.

Figure 11:
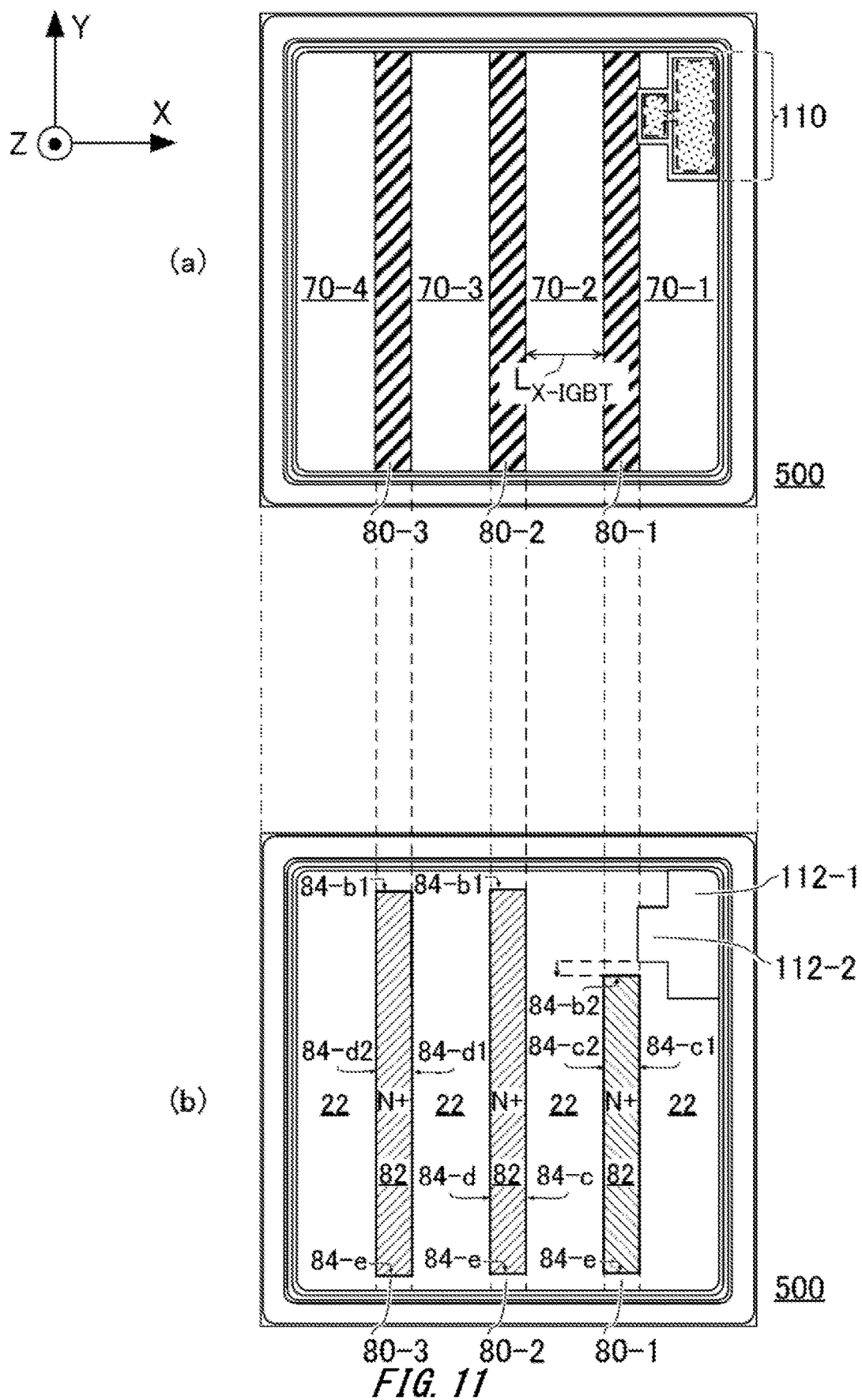
FIG. 11 includes top views (a) and (b) showing a semiconductor device 500 relating to a second modification example of the second embodiment.

FIG. 11 includes top views (a) and (b) showing a semiconductor device 500 relating to a second modification example of the second embodiment. When compared with the pad region 110 shown in the view (a) of FIG. 9, the pad region 110 shown in the view (a) of FIG. 11 is rotated clockwise by 90 degrees within the X-Y plane. The positioning of the pad region 110 in the active region 10 shown in the view (a) of FIG. 11 is obtained by rotating the positioning of the pad region 110 in the active region 10 shown in the view (a) of FIG. 10 clockwise by 90 degrees within the X-Y plane. The view (b) in FIG. 11 corresponds to the view (a) in FIG. 11 and shows the areas occupied the collector regions 22 and the cathode regions 82 (the shaded portions) occupy.

According to the view (a) of FIG. 11, the FWD region 80-1 is the closest to the pad region 110 and the FWD region 80-2 is the second closest to the pad region 110. According to the view (a) of FIG. 11, the pad region 110 does not extend beyond the FWD region 80-1 in the X-axis direction. Accordingly, the distance between the pad region 110 and the FWD region 80-2 can be made longer than in the second embodiment. This can further improve the breakdown withstand capability of the semiconductor device 500 during reverse recovery.

The edge 84-$b$2 of the cathode region 82 corresponding to the FWD region 80-1 may be positioned at the same position in the Y-axis direction as the edges 84-$b$1 of the cathode regions 82 corresponding to the FWD regions 80-2 and 80-3, as one of the edges of the pad well region 112-2 that is relatively positioned on the negative side in the Y-axis direction, or may be relatively positioned on the negative side in the Y-axis direction when compared with the edge of the pad well region 112-2 that is relatively positioned on the negative side in the Y-axis direction. In the present embodiment, the edge 84-$b$2 of the cathode region 82 is positioned between the edge of the pad well region 112-1 that is relatively positioned on the negative side in the Y-axis direction and the edge of the pad well region 112-2 that is relatively positioned on the negative side in the Y-axis direction.

Figure 12:
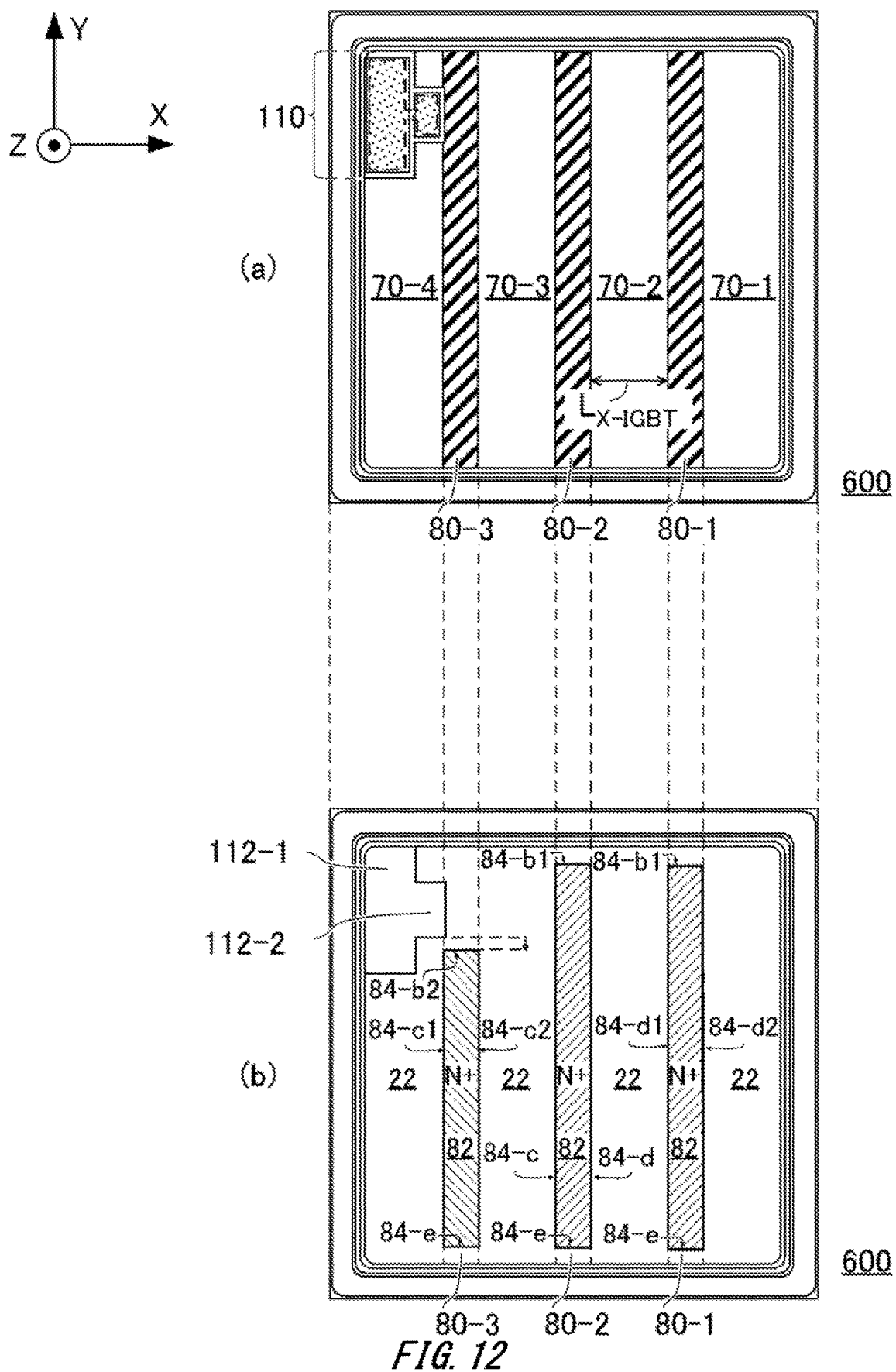
FIG. 12 includes top views (a) and (b) showing a semiconductor device 600 relating to a third modification example of the second embodiment.

FIG. 12 includes top views (a) and (b) showing a semiconductor device 600 relating to a third modification example of the second embodiment. The pad region 110 shown in the view (a) of FIG. 12 is obtained by rotating the pad region 110 shown in the view (a) of FIG. 10 counterclockwise by 90 degrees within the X-Y plane. The view (a) of FIG. 12 is, in other words, obtained by rotating the semiconductor device 300 shown in the view (a) of FIG. 9 counterclockwise by 90 degrees within the X-Y plane. The view (b) in FIG. 12 corresponds to the view (a) of FIG. 12 and shows the areas occupied by the collector regions 22 and the cathode regions 82 (the shaded portions).

According to the view (a) of FIG. 12, the FWD region 80-3 is the closest to the pad region 110 and the FWD region 80-2 is the second closest to the pad region 110. According to the view (a) of FIG. 12, the pad region 110 does not extend beyond the FWD region 80-3 in the X-axis direction. Accordingly, the distance between the pad region 110 and the FWD region 80-2 can be made longer than in the second embodiment. In the third modification example, the edge 84-$b$2 of the cathode region 82 corresponding to the FWD region 80-3 may be similarly arranged to the edge 84-$b$2 of the cathode region 82 corresponding to the FWD region 80-1 in the second modification example (FIG. 11).

Figure 13:
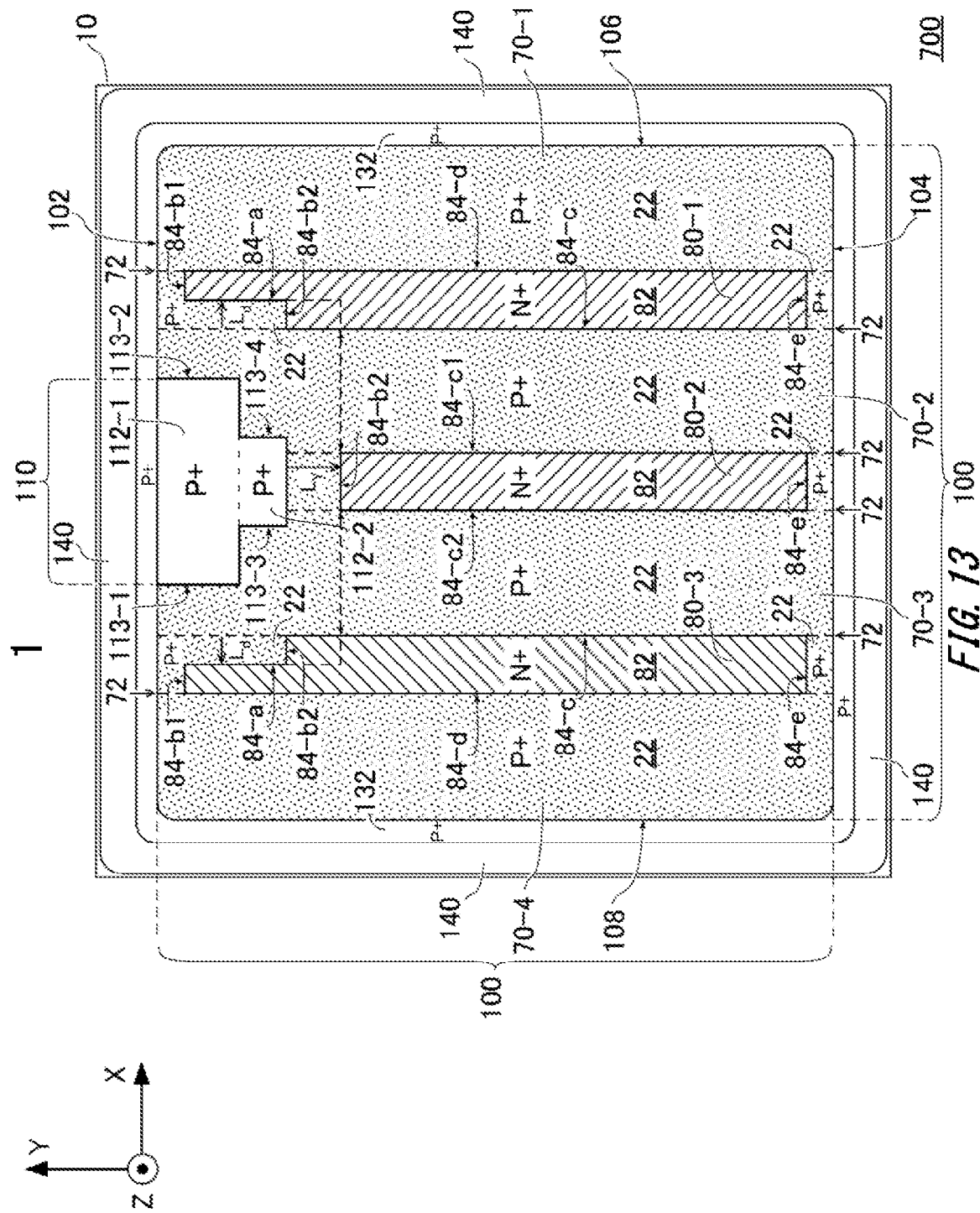
FIG. 13 shows the areas occupied by the collector region 22 and the cathode region 82 in a semiconductor device 700 relating to a third embodiment.

FIG. 13 shows the areas occupied by the collector regions 22 and the cathode regions 82 in a semiconductor device 700 relating to a third embodiment. FIG. 13 corresponds to FIG. 2 and shows that the edge 84-$b$2 of the cathode region 82 corresponding to the FWD region 80-2 is positioned back by a length $L_Y$ in the Y-axis direction.

The edge 84-$b$2 of the cathode region 82 corresponding to the FWD region 80-2 may oppose the pad well region 112 in the Y-axis direction and may be in the vicinity of the pad well region 112 in the Y-axis direction. In the present embodiment, the FWD region 80-2 is described as an example of a different FWD region 80. The FWD region 80-2 extends in the Y-axis direction from the pad well region 112 toward the edge 104. The edge 104 is described as an example of a different edge.

In the present embodiment, the edge 84-$b$2 of the cathode region 82 is spaced away from the pad well region 112 (more specifically, the pad well region 112-2). The edge 84-$b$2 may be positioned back from the edge of the pad well region 112-2 that is relatively positioned on the negative side in the Y-axis direction by a distance of approximately 100 μm, more specifically by a distance equal to or greater than 100 μm. Note that, as described above, the collector regions 22 are provided in the FWD regions 80 in such a manner as to fill the regions by which the cathode regions 82 are positioned back. Even if the edge 84-$b$2 of the cathode region 82 is positioned back, the FWD region 80 is still considered to extend from the edge of the pad well region 112-2 that is relatively positioned on the negative side in the Y-axis direction to the edge 104.

In the present embodiment, the edge 84-$b$2 of the cathode region 82 is spaced away from the pad well region 112-2. This can reduce the electric field concentration at the position in the FWD region 80 that corresponds to the edge 84-$b$2 of the cathode region 82. In addition, the edges 84-$b$2 of the cathode regions 82 of the FWD regions 80-1 and 80-3 may be also positioned back to the same position in the Y-axis direction as the edge 84-$b$2 of the cathode region 82 of the FWD region 80-2. In this case, the edges 84-$a$ and 84-$b$2 of the cathode regions 82 corresponding to the FWD regions 80-1 and 80-3 may be positioned as indicated by the dotted lines.

Such features of the present embodiment that the edge 84-$b$2 is spaced away from the pad well region 112 in the Y-axis direction may be applied to the second embodiment (FIG. 9), the first modification example of the second embodiment (FIG. 10), the second modification example of the second embodiment (FIG. 11) and the third modification example of the second embodiment (FIG. 12). When the above-described features of the present embodiment are applied to the second modification example of the second embodiment (FIG. 11), the edge 84-*b*1 of the cathode region 82 corresponding to the FWD region 80-1, which is the closest to the pad well region 112, may be aligned with or positioned back in the negative Y-axis direction from one of the edges of the pad well region 112-2 that is relatively positioned on the negative side in the Y-axis direction. In addition, the edge 84-*b*1 of the cathode region 82 may be aligned with or positioned back in the negative Y-axis direction from one of the edges of the pad well region 112-1 that is relatively positioned on the negative side in the Y-axis direction.

Likewise, when the above-described features of the present embodiment are applied to the third modification example of the second embodiment (FIG. 12), the edge 84-*b*1 of the cathode region 82 corresponding to the FWD region 80-3 may be aligned with or positioned back in the negative Y-axis direction from one of the edges of the pad well region 112-2 that is relatively positioned on the negative side in the Y-axis direction. In addition, the edge 84-*b*1 of the cathode region 82 may be aligned with or positioned back in the negative Y-axis direction from one of the edges of the pad well region 112-1 that is relatively positioned on the negative side in the Y-axis direction. The positioning-back length may be determined with reference to the trade-off between the conduction loss in the FWD regions 80 and the effects of reducing electric field concentration.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising a plurality of transistor regions and a plurality of diode regions in a single semiconductor substrate, the semiconductor device comprising:

the plurality of transistor regions and the plurality of diode regions each extending from a given one edge of an active region to a different and opposing edge of the active region, the active region being enclosed within a gate runner region that is shaped like a rectangular ring having four sides when the semiconductor substrate is seen from above;

a pad well region of a first conductivity type provided in the semiconductor substrate on an upper-surface side thereof, the pad well region being in contact with the gate runner region that is shaped like the rectangular ring and positioned within the gate runner region; and a plurality of collector regions of a first conductivity type and a plurality of cathode regions of a second conductivity type provided in a lower-surface-side portion of the semiconductor substrate, the plurality of collector regions being at least provided in the plurality of transistor regions in a one-to-one correspondence, and the plurality of cathode regions being provided in the plurality of diode regions in a one-to-one-correspondence, wherein the pad well region ends at a first edge in an arranging direction, the first edge extends in an extending direction, and the arranging direction in which the plurality of transistor regions and the plurality of diode regions are arranged next to each other is orthogonal to the extending direction in which the plurality of transistor regions and the plurality of diode regions extend, any one or more of the plurality of collector regions are positioned below the first edge of the pad well region, the plurality of diode regions include a different diode region that opposes the pad well region in the extending direction, and extends in the extending direction from the pad well region, and when the semiconductor substrate is seen from above, an edge of another one of the plurality of cathode regions corresponding to the different diode region that opposes the pad well region in the extending direction is spaced away from the pad well region.

2. The semiconductor device as set forth in claim 1, wherein the pad well region ends at a second edge opposing the first edge in the arranging direction, the second edge extending in the extending direction, each of the first edge and the second edge of the pad well region is in contact with one of the plurality of transistor regions, and the any one or more of the plurality of collector regions are positioned below the first edge and the second edge of the pad well region.

3. The semiconductor device as set forth in claim 1, wherein the pad well region is in contact with the given one edge of the active region and positioned in a vicinity of a middle of the given one edge in the arranging direction.

4. The semiconductor device as set forth in claim 1, wherein when the semiconductor substrate is seen from above, the plurality of transistor regions are positioned at the given one edge of the active region and the opposing edge of the active region in the arranging direction of the pad well region, and the pad well region is in contact with a corner of the active region.

5. The semiconductor device as set forth in claim 1, wherein:

the pad well region has a "T-shape" when the semiconductor substrate is seen from above.

6. The semiconductor device as set forth in claim 1, wherein:

an end portion of at least one of the plurality of cathode regions opposing the pad well region includes an "L-shaped" notch.

7. A semiconductor device comprising a plurality of transistor regions and a plurality of diode regions in a single semiconductor substrate, the semiconductor device comprising:

the plurality of transistor regions and the plurality of diode regions each extending from a given one edge of an active region to a different and opposing edge of the active region, the active region being enclosed within a gate runner region that is shaped like a rectangular ring having four sides when the semiconductor substrate is seen from above;

a pad well region of a first conductivity type provided in the semiconductor substrate on an upper-surface side thereof, the pad well region being in contact with the gate runner region that is shaped like the rectangular ring and positioned within the gate runner region; and a plurality of collector regions of a first conductivity type and a plurality of cathode regions of a second conductivity type provided in a lower-surface-side portion of the semiconductor substrate, the plurality of collector regions being at least provided in the plurality of transistor regions in a one-to-one correspondence, and the plurality of cathode regions being provided in the plurality of diode regions in a one-to-one-correspondence, wherein the pad well region ends at a first edge in an arranging direction, the first edge extends in an extending direction, and the arranging direction in which the plurality of transistor regions and the plurality of diode regions are arranged next to each other is orthogonal to the extending direction in which the plurality of transistor regions and the plurality of diode regions extend, and any one or more of the plurality of collector regions are positioned below the first edge of the pad well region, wherein the pad well region ends at a second edge opposing the first edge in the arranging direction, the second edge extending in the extending direction, each of the first edge and the second edge of the pad well region is in contact with one of the plurality of transistor regions, the any one or more of the plurality of collector regions are positioned below the first edge and the second edge of the pad well region, the pad well region is in contact with two of the plurality of transistor regions and one of the plurality of diode regions that is positioned between the two transistor regions, the first edge of the pad well region is in contact with a first transistor region of the two transistor regions, and the second edge of the pad well region is in contact with a second transistor region of the two transistor regions that is differently positioned than the first transistor region.

8. A semiconductor device comprising a plurality of transistor regions and a plurality of diode regions in a single semiconductor substrate, the semiconductor device comprising:

the plurality of transistor regions and the plurality of diode regions each extending from a given one edge of an active region to a different and opposing edge of the active region, the active region being enclosed within a gate runner region that is shaped like a rectangular ring having four sides when the semiconductor substrate is seen from above;

a pad well region of a first conductivity type provided in the semiconductor substrate on an upper-surface side thereof, the pad well region being in contact with the gate runner region that is shaped like the rectangular ring and positioned within the gate runner region; and a plurality of collector regions of a first conductivity type and a plurality of cathode regions of a second conductivity type provided in a lower-surface-side portion of the semiconductor substrate, the plurality of collector regions being at least provided in the plurality of transistor regions in a one-to-one correspondence, and the plurality of cathode regions being provided in the plurality of diode regions in a one-to-one-correspondence, wherein the pad well region ends at a first edge in an arranging direction, the first edge extends in an extending direction, and the arranging direction in which the plurality of transistor regions and the plurality of diode regions are arranged next to each other is orthogonal to the extending direction in which the plurality of transistor regions and the plurality of diode regions extend, any one or more of the plurality of collector regions are positioned below the first edge of the pad well region, the semiconductor device comprises a given one of the plurality of diode regions that is not in contact with the pad well region, the given one of the plurality of diode regions being positioned opposite the pad well region in the arranging direction with a given one of the plurality of transistor regions that is in contact with the pad well region being sandwiched therebetween, and one of the plurality of cathode regions corresponding to the given one of the plurality of diode regions has an edge that opposes the second edge of the pad well region in the arranging direction and extends in the extending direction, a positioned-back portion of the edge of the one of the plurality of cathode regions being positioned opposite the second edge of the pad well region with a boundary between (i) the given one transistor region that is in contact with the pad well region and (ii) the given one diode region that is not in contact with the pad well region being sandwiched therebetween, and the positioned-back portion of the edge of the one of the plurality of cathode regions is positioned back from the pad well region in the arranging direction from the pad well region toward the given one diode region farther than a remainder of the edge of the one of the plurality of cathode regions.

9. The semiconductor device as set forth in claim 8, wherein the positioned-back edge of the one of the plurality of cathode regions is spaced away from the second edge of the pad well region by a distance equal to or greater than a thickness of the semiconductor substrate.

10. The semiconductor device as set forth in claim 8, wherein the positioned-back edge portion of the one of the plurality of cathode regions is spaced away from the boundary by a distance equal to or greater than 90 μm.

11. The semiconductor device as set forth in claim 8, wherein the semiconductor substrate includes a lifetime killer region that is provided between (i) the plurality of collector regions and the plurality of cathode regions and (ii) an upper surface of the semiconductor substrate and above the positioned-back edge portion of the plurality of cathode regions.

12. A semiconductor device comprising a plurality of transistor regions and a plurality of diode regions in a single semiconductor substrate, the semiconductor device comprising:

the plurality of transistor regions and the plurality of diode regions each extending from a given one edge of an active region to a different and opposing edge of the active region, the active region being enclosed within a gate runner region that is shaped like a rectangular ring having four sides when the semiconductor substrate is seen from above;

a pad well region of a first conductivity type provided in the semiconductor substrate on an upper-surface side thereof, the pad well region being in contact with the gate runner region that is shaped like the rectangular ring and positioned within the gate runner region; and a plurality of collector regions of a first conductivity type and a plurality of cathode regions of a second conductivity type provided in a lower-surface-side portion of the semiconductor substrate, the plurality of collector regions being at least provided in the plurality of transistor regions in a one-to-one correspondence, and the plurality of cathode regions being provided in the plurality of diode regions in a one-to-one-correspondence, wherein the pad well region ends at a first edge in an arranging direction, the first edge extends in an extending direction, and the arranging direction in which the plurality of transistor regions and the plurality of diode regions are arranged next to each other is orthogonal to the extending direction in which the plurality of transistor regions and the plurality of diode regions extend, any one or more of the plurality of collector regions are positioned below the first edge of the pad well region, the gate runner region shaped like the rectangular ring includes a gate runner well region of a first conductivity type that is provided in the semiconductor substrate on an upper-surface side thereof, and the semiconductor substrate comprises a lifetime killer region extending, when seen from above, in the extending direction from the active region to a predetermined position in the gate runner well region.

13. A semiconductor device comprising a plurality of transistor regions and a plurality of diode regions in a single semiconductor substrate, the semiconductor device comprising:

the plurality of transistor regions and the plurality of diode regions each extending from a given one edge of an active region to a different and opposing edge of the active region, the active region being enclosed within a gate runner region that is shaped like a rectangular ring having four sides when the semiconductor substrate is seen from above;

a pad well region of a first conductivity type provided in the semiconductor substrate on an upper-surface side thereof, the pad well region being in contact with the gate runner region that is shaped like the rectangular ring and positioned within the gate runner region; and a plurality of collector regions of a first conductivity type and a plurality of cathode regions of a second conductivity type provided in a lower-surface-side portion of the semiconductor substrate, the plurality of collector regions being at least provided in the plurality of transistor regions in a one-to-one correspondence, and the plurality of cathode regions being provided in the plurality of diode regions in a one-to-one-correspondence, wherein the pad well region ends at a first edge in an arranging direction, the first edge extends in an extending direction, and the arranging direction in which the plurality of transistor regions and the plurality of diode regions are arranged next to each other is orthogonal to the extending direction in which the plurality of transistor regions and the plurality of diode regions extend, any one or more of the plurality of collector regions are positioned below the first edge of the pad well region, at least one diode region of the plurality of diode regions includes a plurality of contact portions provided on an upper surface of the semiconductor substrate in the active region, the plurality of contact portions extending in the extending direction and spaced away from each other in the arranging direction, the gate runner region includes a gate runner well region of a first conductivity type provided in the semiconductor substrate on an upper-surface side thereof, the gate runner well region is in contact with the at least one of the plurality of diode regions in the extending direction, and an edge of the gate runner well region that is in contact with the active region opposes in the extending direction an edge of one of the plurality of cathode regions corresponding to the at least one of the plurality of diode regions, and when the edge of the gate runner well region and the edge of the one of the plurality of cathode regions are imaginarily projected onto the upper-surface side of the semiconductor substrate, a first distance is greater than a depth from the upper-surface side of the semiconductor substrate to a bottom of the gate runner well region and less than a thickness of the semiconductor substrate between the upper-surface side and a lower surface, and the first distance is a shortest distance between the edge of the gate runner well region and the edge of the one of the plurality of cathode regions.

14. The semiconductor device as set forth in claim 13, wherein an edge of the gate runner well region opposes in the extending direction an edge of at least one contact portion of the plurality of contact portions, and when the edge of the gate runner well region and the edge of the at least one contact portion are imaginarily projected onto the upper surface of the semiconductor substrate, the first distance is greater than a second distance, and the second distance is a shortest distance between the edge of the gate runner well region and the edge of the at least one contact portion.

* * * * *